United States Patent
Dehlsen et al.

(10) Patent No.: US 10,264,711 B2
(45) Date of Patent: Apr. 16, 2019

(54) DATA VESSEL INTEGRATED WITH COOLING AND DOCKING STATION WITH ANCILLARY SERVICE

(71) Applicant: Data Marine, LLC, Santa Barbara, CA (US)

(72) Inventors: James G. P. Dehlsen, Santa Barbara, CA (US); Alexander J. Fleming, San Francisco, CA (US)

(73) Assignee: Data Marine, LLC, Santa Barbara, CA (US)

( * ) Notice: Subject to any disclaimer, the term of this patent is extended or adjusted under 35 U.S.C. 154(b) by 0 days.

(21) Appl. No.: 15/365,720

(22) Filed: Nov. 30, 2016

(65) Prior Publication Data

US 2018/0153059 A1    May 31, 2018

(51) Int. Cl.
H05K 7/20 (2006.01)
(52) U.S. Cl.
CPC ................. H05K 7/20754 (2013.01)
(58) Field of Classification Search
CPC .. H05K 7/203; H05K 7/20763–7/2079; H05K 7/20718–7/20754; H05K 7/1497
USPC .......... 361/679.46–679.54, 688–723
See application file for complete search history.

(56) References Cited

U.S. PATENT DOCUMENTS

| | | | |
|---|---|---|---|
| 1,757,174 A | 5/1930 | Douglas | |
| 2,870,729 A | 1/1959 | Shannon et al. | |
| 3,138,131 A | 6/1964 | Szychlinski | |
| 3,339,511 A | 9/1967 | Daniell | |
| 4,411,213 A | 10/1983 | Laukien | |
| 5,511,504 A | 4/1996 | Martin | |
| 5,544,610 A | 8/1996 | Harding | |
| 6,776,559 B1 | 8/2004 | Peterson | |
| 6,819,563 B1* | 11/2004 | Chu | G11B 33/1406 165/104.33 |
| 7,278,273 B1 | 10/2007 | Whitted et al. | |
| 7,525,207 B2 | 4/2009 | Clidaras et al. | |

(Continued)

FOREIGN PATENT DOCUMENTS

| | | |
|---|---|---|
| DE | 1020111156557 A1 | 3/2013 |
| KR | 10-2009-0106450 A | 10/2009 |
| WO | WO 2012/1001535 A1 | 1/2012 |

OTHER PUBLICATIONS

O'Hara (Sep. 12, 2008) "The Under Water Data Center, Response to Risks of Google's Floating Data Center, Submerge," Green Data Center Blog. Accessible on the Internet at URL: http://www.greenm3.com/gdcblog/2008/9/12/the-under-water-data-center-response-to-risks-of-googlersquo.html.

(Continued)

*Primary Examiner* — Zachary Pape
(74) *Attorney, Agent, or Firm* — San Diego IP Law Group LLP; Trevor Coddington

(57) ABSTRACT

A marine subsea data vessel includes a plurality of server boards, in certain embodiments forming a carousel, coupled with a heat exchanger. The heat exchanger operates to extract heat and transfer the heat to seawater entirely surrounding the marine subsea data vessel. The heat transfer may be through the outer shell of the vessel, or via an external heat exchanger, or both. Various heat exchanger configurations provide additional heat transfer efficiency. The subsea data vessel may be clustered providing additional advantages. The subsea data vessel may be powered via a variety of power sources.

22 Claims, 21 Drawing Sheets

(56) References Cited

U.S. PATENT DOCUMENTS

| | | | |
|---|---|---|---|
| 7,983,041 B2* | 7/2011 | Godfroy | H05K 5/06 |
| | | | 165/104.33 |
| 8,564,150 B2 | 10/2013 | Shpinev | |
| 8,659,179 B2 | 2/2014 | Rhinefrank et al. | |
| 8,867,204 B1* | 10/2014 | Gardner | H05K 7/1497 |
| | | | 361/679.46 |
| 9,593,876 B2* | 3/2017 | Smith | H05K 7/20218 |
| 9,844,167 B2* | 12/2017 | Peterson | H05K 7/20836 |
| 9,913,409 B2* | 3/2018 | Cutler | H05K 7/20836 |
| 2006/0191457 A1 | 8/2006 | Murphy | |
| 2011/0058815 A1 | 3/2011 | Plentl | |
| 2013/0106105 A1 | 5/2013 | Dehlsen et al. | |
| 2014/0185225 A1* | 7/2014 | Wineland | G06F 1/20 |
| | | | 361/679.31 |
| 2014/0259618 A1* | 9/2014 | Damus | B22D 31/00 |
| | | | 29/463 |
| 2015/0009621 A1* | 1/2015 | Baldinger | H05K 7/20745 |
| | | | 361/679.47 |
| 2015/0321739 A1 | 11/2015 | Dehlsen | |
| 2016/0081780 A1 | 3/2016 | Johnsen et al. | |
| 2016/0381841 A1 | 12/2016 | Peterson et al. | |
| 2018/0054916 A1* | 2/2018 | Kosugi | H05K 7/1497 |

OTHER PUBLICATIONS

Hamilton (2007) "An Architecture for Modular Data Centers," In; 3rd Biennial Conference on Innovative Data Systems Research (CIDR), Jan. 7-10, 2007. Microsoft Corporation, Asilomar, California, USA. pp. 306-313.

Ray, "Salesforce, Google, Amazon Cloud Winners, Says Piper; Microsoft Straddles the Line", Oct. 17, 2013, http://blogs.barrons.com/techtraderdaily/2013/10/17/salesforce-google-amazon-cloud-winners-says-piper-microsoft-straddles-the-line/, accessed Nov. 18, 2016.

Vaughan-Nichols, "Cisco projects data center-cloud traffic to triple by 2017", Oct. 15, 2013, http://www.zdnet.com/article/cisco-projects-data-center-cloud-traffic-to-triple-by-2017/, accessed Nov. 18, 2016.

* cited by examiner

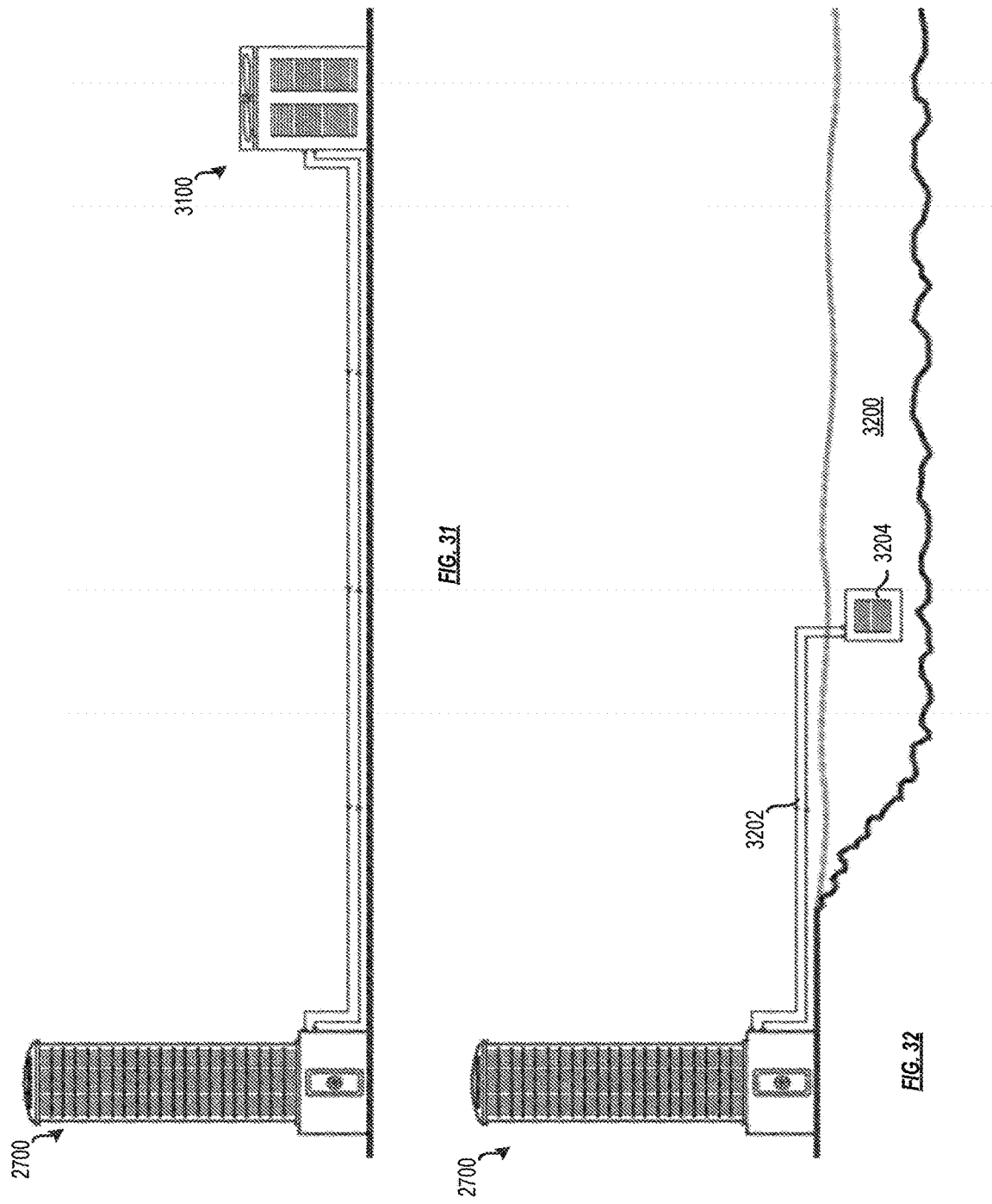

DATA VESSEL INTEGRATED WITH COOLING AND DOCKING STATION WITH ANCILLARY SERVICE

BACKGROUND

Cloud computing has risen in prominence over the last decade. "Throughout the next five years, a 44% annual growth in workloads for the public Cloud versus an 8.9% growth for "on-premise" computing workloads is expected." (Woods, 2014, SiliconAngle). More than 60% of businesses utilize the Cloud for performing IT-related operations." (Woods, 2014, SiliconAngle). "Cisco forecasts that global data center traffic will triple from 2.6 zettabytes in 2012 to 7.7 zettabytes annually in 2017, representing a 25 percent compound annual growth rate (CAGR)" (Woods, 2014, SiliconAngle). "From 2012 to 2017, data center workloads will grow 2.3-fold; Cloud workloads will grow 3.7-fold" (Woods, 2014, SiliconAngle). Presently data centers comprise 3% of the electric power load (Chalise et al, 2015, IEEE).

Energy sources including renewables and energy efficiency must scale with the data center growth rate. Today's land based data centers require a great deal of fore planning with months to years build out, frequently with voluminous water consumption in chilled water evaporation where server density is limited by cooling capacity. Furthermore data centers can take up large parcels of land and operate with poor power utilization efficiency (PUE), all the while requiring high operational reliability and often necessitating on-site backup power generators and fuel supply among other redundancies.

The various implementations and types of data centers are readily apparent to one of ordinary skill in the art. For example, U.S. Pat. No. 7,278,273 to Whitted discusses a modular data center with modular components suitable for use with rack mounted or shelf mounted computing systems. The modular data center is housed in an intermodal shipping container and computing systems mounted within the container are arranged to be shipped and operated within the container. The modular data center includes a temperature control system for maintaining the air temperature surrounding the computing systems.

U.S. Pat. No. 7,525,207 to Clidaras et al. describes a ship outfitted with computer servers located in shipping containers, which are cooled by ocean water that is pumped through heat exchangers. Electric power is supplied by wave or marine current electric power generating devices connected by power cables to the ship. Such a floating vessel is vulnerable to extreme weather and sea states. Ocean vessel operators typically steer away from areas where intense storms and/or destructive wave action are present or incoming, in order to avoid potential damage to their vessels and cargo. Following this precedent would require severing the data center connections to shore impacting its reliability and availability.

SUMMARY OF THE EMBODIMENTS

In an embodiment, a data vessel includes: an outer shell forming an interior space; at least one data server including a plurality of server boards forming a carousel located in the interior space, the carousel having an inner plenum aligned on an axis of the data vessel; and a heat exchanger adapted to disperse heat generated by the plurality of server boards to the exterior of the data vessel.

In embodiments, the outer shell may be sealed with at least one endcap.

In embodiments, at least one of the at least one endcap may include a hatch providing access to the interior space.

In embodiments, the outer shell may include one or more radial rings and/or one or more longitudinal stiffeners to withstand hydrostatic buckling.

In embodiments, the data vessel may further include a communications interface for transferring data to and/or from the at least one data server. In embodiments, the communications interface may transfer data to and/or from the plurality of server boards. In embodiments, the communications interface may be selected from the group of communications interface including: wired communication protocols, and wireless communications protocols including, wireless cellular links, line of sight satellite, WiFi, balloon and solar/microwave beam powered drones.

In embodiments the data vessel may further include electric cables to the exterior to provide power to the at least one data server and cooling equipment.

In embodiments, the heat exchanger may include an internal heat exchanger, an external heat exchanger, and a coolant pump adapted to cycle coolant through a closed loop cycle including: through the internal heat exchanger, through the outer shell via an outlet into the external heat exchanger, and back into the internal heat exchanger via an inlet through the outer shell. In embodiments, the external heat exchanger may be in surrounding cooler seawater.

In embodiments, the data vessel may further include an internal fan for circulating air, or propulsor for circulating fluid, within the interior space in a toroidal circulation pattern such that the air or fluid rises on an inner surface of the outer shell and cooled air or fluid descends within the inner plenum. In embodiments, the internal fan or propulsor may be (i) located at an endcap sealed to the outer shell, (ii) a barrel fan or propulsor located within the inner plenum, or (iii) caused widening of spacing of the server boards within the carousel such that thermal expansion of the air or fluid due to heat generated by the plurality of server boards causes convective flow to propel the air or fluid towards the outer shell.

In embodiments, the internal heat exchanger comprising a concentric heat exchanger in the endcap or in the inner plenum of the carousel.

In embodiments, the internal heat exchanger may include a concentric heat exchanger at an inner diameter of the server carousel.

In embodiments, the internal heat exchanger may include a concentric heat exchanger at an outer diameter of the carousel.

In embodiments, the coolant pump may be located external to the data vessel.

In embodiments, the heat exchanger may include a second coolant pump, and, an interior manifold coupled to at least a portion of the server boards. In embodiments, the second coolant pump may be adapted to cycle coolant through the interior manifold to extract heat directly by conduction from the server boards coupled thereto.

In embodiments, the heat exchanger may include a coolant pump, and, an interior manifold coupled to at least a portion of the server boards, the coolant pump adapted to cycle coolant through the interior manifold to extract heat directly from the server boards coupled thereto.

In embodiments, a liquid coolant, the plurality of server boards being immersed therein, a condenser located in an air gap within the interior space, and a coolant pump adapted to cycle coolant from the vessel exterior through the condenser; the heat exchanger being configured such that heat generated by the plurality of server boards vaporizes the liquid coolant and vapor bubbles rise to the air gap for condensing on the condenser.

In embodiments, the coolant pump may be further adapted to cycle the coolant through the outer shell and through an external heat exchanger, and then back through the outer shell and into the condenser.

In embodiments, the liquid coolant may include a di-electric liquid.

In embodiments, the data vessel may be adapted for vertical positioning such that the air gap is located near an endcap sealed with the outer shell.

In embodiments, the heat exchanger may include an external and an internal heat exchanger portions, the external heat exchanger portion including one or both of a marine keel cooler and a mini-tube heat exchanger.

In embodiments, the keel cooler may be configured substantially parallel with a longitudinal axis of the data vessel.

In embodiments, the mini-tube heat exchanger may be configured substantially around a radial surface of the outer shell.

In embodiments, the heat exchanger may comprise a liquid coolant completely filling the interior space.

In embodiments, the data vessel may be configured such that the internal convection circulation of the coolant within the interior space cools the server boards by conduction of heat through the outer shell to the surrounding seawater. The vessel may also be configured to optimize the external surface of the vessel in carrying the heat away by exterior convective circulation of the surrounding seawater.

In embodiments, the liquid coolant is incompressible, and the outer shell being a thin walled membrane that would not withstand hydrostatic buckling but for the liquid coolant entirely filling the interior space.

In embodiments, the data vessel may include a pressure regulator for creating a higher internal pressure within the interior space than outside the interior space to prevent seawater ingress.

In embodiments, the data vessel may include a depth regulator for controlling the depth of the data vessel.

In embodiments, the depth regulator comprising one or more of a ballast adjustment and/or winch attached to a vertical mooring line, or by a dive plane in a current.

In embodiments, the data vessel may further include a submersible chamber attached to the data vessel, the chamber being moored and having a power and communication cables and including ancillary support equipment for the data vessel.

In embodiments, the chamber includes a hatch thereon such that, when surfaced, the hatch and a top portion of the data vessel are above a surface of a cooling medium outside the data vessel. The heat exchanger may be coupled to the chamber such that, when surfaced, the heat exchanger is below the surface of the cooling medium for continued operation when the chamber and data vessel is surfaced In embodiments the chamber with data vessels operates below the surface, moored long term to the seabed and can be brought to the surface, where a data vessel(s) can be replaced, as needed, while the other data vessels continue to operate. The docking station and data vessels are the returned to the selected operating depth by its depth control system(s).

In embodiments the chamber provides for all data vessel(s), electric and communication cables and hydraulic lines, connections to the chamber, to be made above the water surface.

In embodiments, data vessel change-out is performed by surface deck crane to hoist each removable data vessel up and away from the chamber for pickup and replacement by an operating crew service vessel.

In embodiments, the chamber is accessible by surface deck hatch and the chamber comprises some or all of the systems required for data vessel operation, including: systems controller, exterior heat exchangers, coolant pumps, server networking, fiber optic and other transmission connections, electric power transformers and switching and SCADA system and their respective connecting cables and tubing to the data vessel.

In embodiments, the chamber may include a first longitudinal axis, the data vessel having a second longitudinal axis, the first longitudinal axis being substantially parallel with the second longitudinal axis and may also include non-parallel and perpendicular first and second axis.

In embodiments, the chamber may include a first longitudinal axis, the data vessel comprising a plurality of data vessels, each having a respective second longitudinal axis, the first longitudinal axis being substantially parallel with the second longitudinal axis.

In embodiments, each of the second longitudinal axes may be offset from each other.

In embodiments, each of the second longitudinal axes may be aligned with each other.

In embodiments, the data vessel and/or chamber may be grid connected and/or coupled with a marine hydrokinetic power source or other marine based renewable source for powering the chamber and/or data vessels.

In embodiments, the power source may include a marine hydrokinetic power source.

In embodiments, the power source may include a fuel cell based on natural gas.

In embodiments, the power source may include a nuclear power source.

In embodiments, the chamber may be coupled to at least one additional data vessel forming a cluster of data vessels.

In embodiments, the chamber may be removably coupled to the data vessel while the chamber is moored at sea.

In embodiments, the chamber may include ancillary equipment utilized by the data vessel including one or more of an external heat exchanger, transformer, power and conditioning systems, data network, controls/supervisory control and data acquisition, and an umbilical conduit for drawing cool external fluid from below the data vessel.

In embodiments, connections between the data vessel and chamber may be accessible when the chamber is surfaced and the outer shell is only partly surfaced.

In embodiments, the chamber may be coupled to two additional data vessels in a horizontal configuration, the chamber having a hatch extending vertically.

In embodiments, the chamber may be coupled to a plurality of additional data vessels in a vertical configuration, the chamber having a center of buoyancy near a top of the chamber and a center of mass near a bottom of the chamber.

In embodiments, the data vessel may be a land-based data vessel. The outer shell may be attached, in vertical configuration, to a base including an entry way. In embodiments the base may include a lift for providing access to the interior plenum.

In embodiments, the data vessel may be partitioned into sections, each section optimized for cooling circulation and heat extraction.

It should be appreciated that any feature of the embodiments above, or discussed below, may be combined with other feature(s) of embodiment(s) without departing from the scope hereof.

BRIEF DESCRIPTION OF THE FIGURES

The foregoing and other features and advantages of the disclosure will be apparent from the more particular description of the embodiments, as illustrated in the accompanying drawings, in which like reference characters refer to the same parts throughout the different figures. The drawings are not necessarily to scale, emphasis instead being placed upon illustrating the principles of the disclosure.

FIG. 31 depicts land-based data vessel using cooling supplied by a land-based air (or liquid) cooling system, in an embodiment.

FIG. 32 depicts land-based data vessel using liquid cooling supplied from a local body of water, in an embodiment.

DETAILED DESCRIPTION OF THE EMBODIMENTS

Figure 1:
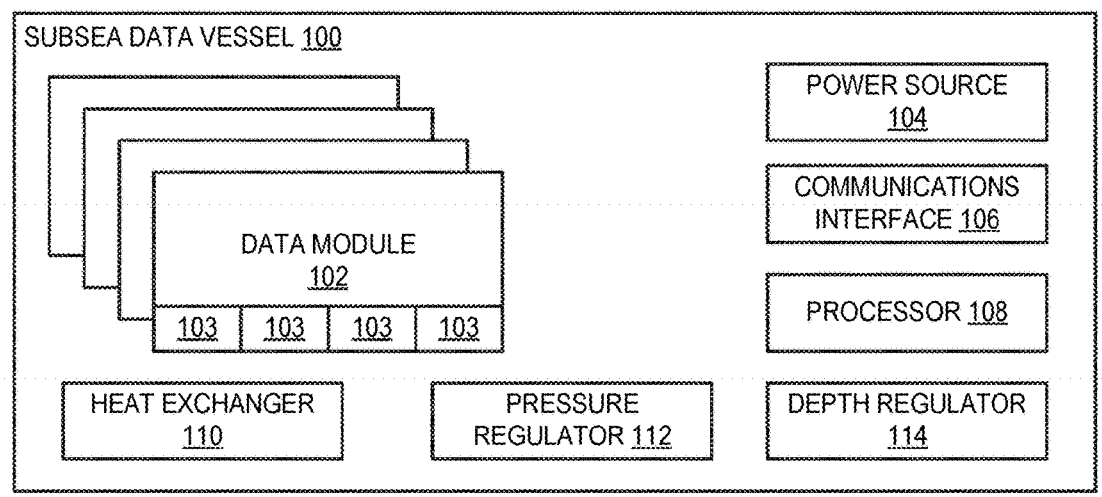
FIG. 1 depicts an exemplary block diagram of a marine subsea data vessel, in embodiments.

Land based data centers are a single point design product, based on the requirements of the location, cooling and backup power requirements. This directly impacts server reliability, uptime and energy efficiency, as design must adapt to wide environmental conditions (temperature and humidity) which impacts thermal cycling of the servers. As an energy use example, a land based data center may lose the following percentages: ~33% cooling, ~4% lighting, ~15% uninterruptable power supplies (UPS) losses, ~10% air handling, ~35% power supplies and 10% transmission and distribution.

Cooling strategies that try to accommodate commercial off the shelf (COTS) racks, server boards (blades), bus bars and data connections and are limited by equipment that is generally air-cooled. Air-air and air-liquid cooling is limited to ~37 kW/42U rack (where a U refers to each rack layer, typically containing two server boards). The physics of air cooling the present generation of server boards and racks governs the layout and computational density to the present day 42U rack (land based data centers).

Fluid Immersion embodiments herein include a new approach, whereby server boards and related equipment may be modified to be immersed in a dielectric incompressible fluid heat transfer media and to be pressure tolerated to resist hydrostatic pressure of marine subsurface deployment. These embodiments allow liquid cooling techniques that are up to 1000× more efficient than air, enabling increases in computational density (thus lowers capital cost) for a given form factor as shown below in Tables 1 and 2. Table 1 shows idle power of various commercial electronic processors. Table 2 shows computational density and power consumption for various processors and related cooling systems, as discussed in the embodiments herein.

TABLE 1

Idle Power for Various Processor Types (lower is better)

| Processor | Idle Power (Watts) |
|---|---|
| Phenom II X6 1110T | 95 |
| FX-8150 | 94 |
| Core i7 3770K | 89 |
| Core i7 2600K | 87 |
| Core i5 2500K | 86 |
| Core i7 3960X | 80 |
| A8-3870K | 79 |
| AMD A8-3870K (IGP) | 52 |
| Intel Core I7 3770K (IGP) | 46 |
| AMD A10-5800K (IGP) | 47 |
| Intel Core I3 2100 (IGP) | 45 |
| AMD A10-6700 (HD 8670D) | 45 |
| AMD A10-6800K (HD 8670D) | 44 |
| Intel Core I5 2500K (IGP) | 43 |
| AMD A8-5600K (IGP) | 38 |

TABLE 2

Idle Power for Various Processor Types (lower is better)

| Air Cooling - Natural Convection | Air Cooling - Forced Convection | Liquid Cooling with Water | Immersion Cooling |
|---|---|---|---|
| h = 5-30 W/m$^2$K | h = 20-400 W/m$^2$K | h = 100-1600 W/m$^2$K | h = 800-1000 W/m$^2$K |
| Q = 2-9 W | Q = 6-120 W | Q = 30-480 W | Q = 240-3000 W |
| Free convection | Free + Forced convection | Forced convection | Free convection |

Certain marine subsea pressure compensated data vessel embodiments herein comprise servers in a closed vessel of a thin walled membrane that can assume any shape as long as it is sealed and slightly biased through a pressure compensation system (typically 5 pounds per square inch (PSI)) to prevent external fluid ingress (i.e., seawater ingress). These thin walled membranes reduce the structural requirements needed to prevent buckling induced by hydrostatic pressure as well as the requirement for material choices namely aluminum, stainless steel, composites and titanium, which are driven by the need for structural stiffness and fracture toughness of the materials. Accordingly these embodiments allow deep, cold water deployment using inexpensive, readily available materials such as Plexiglas, Delrin, phenolics and may include thermally conductive, corrosion and bio-fouling resistant materials.

Certain embodiments herein also include subsea data vessels with lower hydrostatic structural requirements by operating in warmer waters close to the surface and utilizing an umbilical tube to draw cooler water from deeper in the water column to provide the necessary cooling.

Embodiments herein address many of the land based data center impediments and efficiency losses through marine subsea data vessel characteristics. Marine subsea data vessels may operate in a much tighter temperature range (10 to 15° C.) that may be found readily off coastlines around the world where ~50% of the population resides, although the present disclosure is not limited to just such operation areas. These embodiments reduce latency, improve data security and enable standardization of marine subsea data vessels allowing rapid scalability and deployment, for example, in less than 90 days once permits are in place. As the marine subsurface data vessel is submerged in water, cooling is readily available whether by reservoir, lake, pool, ocean or other body of water, manmade or naturally occurring, or formed by the combined actions of humans and nature. Moreover, embodiments of marine subsea data vessels herein may be submerged below depths of conventional diver access and scuttled if a security threat is posed.

The above referenced land or sea barge-based data center has practical limits of 37 kW per a 42U server board rack.

One embodiment herein utilizes closed loop return systems that involve pumping cooled fluid through the shell of a marine subsea data vessel from an external heat exchanger.

Another embodiment herein realizes the cooling benefit of a marine subsea data vessel, optimized at a system level using immersion liquid cooling of the server boards to achieve about 1000 times the efficiency of air.

These supercritical, single and two-phase liquid heat exchanges facilitated by these marine subsea data vessel embodiments, each enable a three series, additive thermal resistance unlike present day land or barge based data center topologies using a single series thermal resistance, air cooled approach.

In these embodiments, the internal pressure of the marine subsea data vessel may fall below, meet, or exceed the surrounding external pressure which drives the skin thickness in resisting hydrostatic pressure as in a conventional marine subsea pressure vessel filled with nitrogen and humidity controlled as necessary for electronic component or server operation.

In a further embodiment, a composite shell that houses higher internal pressure relative to external media has the benefit of thin walls relative to an aluminum/steel construction, as an example, composite shells are more efficient under tension. The thin walled composite membrane with lower thermal resistance counteracts the effects of lower thermal conductivity typical in composites.

Embodiments herein optimize for the physical forces involved in marine subsea applications necessary to reduce structural requirements and improve performance of electronic equipment, server, central processor unit (CPU), power electronics/converters/supplies, etc. and achieve mechanical cooling requirements without the need for complex cooling schemes. Certain closed loop cooling system embodiments herein avoid the issues of bio-fouling, water discharge and corrosion, factors which may be manifested in reliability of the prime mover cooling pumps, fans, internal heat exchangers (e.g. a radiator) or external heat exchangers. These components may present leak paths and suffer heat transfer performance loss from bio-fouling and corrosion.

Certain embodiments herein do not utilize COTS server or electronic equipment that limit the optimization of a marine subsea data vessel. Instead, the server and electronic equipment may be modified to tolerate hydrostatic pressure and allow complete immersion in a dielectric medium such as, but not limited to, deionized water, mineral oil or biodegradable hydraulic fluid. Prior developed liquid-media resistant (or liquid-media proof) electronics used for cooling in standard land based systems, do not achieve the same benefits, because hydrostatic pressure would collapse air pockets within capacitors or other key components. To deal with this, specialty conformal coating and potting in phenolic resin, that if not carefully done, will thermally insulate the components from efficient cooling. Moreover, conformal coatings could also serve for nucleate boiling in a two-phase cooling process, with liquid in contact with heated components such as the CPU, heat sinks and other power conversion equipment, triggering vaporization of the liquid. As described herein, these specialized server and electronic equipment embodiments allow for cooling techniques that enable greater computational density and efficiency in marine subsea data vessels.

Embodiments herein may include conformally coated, pressure tolerant server boards (e.g. server blades), electronic equipment and ancillary data center equipment that are not subject to pressure differentials across the shell of the pressure vessel. Previous art described by Whitted addresses marine subsurface cooling topologies using COTS, air cooled server topologies that are limited in computational density in a closed loop cooling system.

Definitions

The phrase "marine subsea data vessel cluster" indicates a standalone group of marine subsea data vessels joined together by a docking station having, but not limited to or all-inclusive of a seabed mooring system and a dynamic umbilical connection to the main subsea power and data cable to shore.

The phrase "marine subsea data vessel cluster array" indicates a grouping of marine subsea data vessel clusters at a location having a common connection to short side facilities via a main subsea power and/or data cable(s).

The phrase "marine subsea data vessel" indicates a structural element or container with one or more of electrical, fluid and structural interfaces and connections containing, but not limited to or all-inclusive of carousels, trays, server boards, internal heat exchangers, power sources, fans, coolant piping, pressure regulator, communications interface and electrical and data cabling.

The phrase "outer shell" may include an outer housing or container forming an interior space. In embodiments the outer shell may by cylindrical or another shape.

The phrase "endcap" may include a domed or flat end portion of an outer shell serving to seal the outer shell, and, in embodiments, provide access to the interior space.

The phrase "data server" may include one or more data boards forming a server for storing, processing, or networking electronic data. The data boards may be coupled in a carousel configuration, or other configurations without departing from the scope hereof.

The phrase "server board" may include a modular electronic circuit board containing one or a plurality of microprocessors, disk drives or memory chips. In embodiments, the data boards may be in ½U, 1U or multiple U configurations, but may be in alternative configurations without departing from the scope hereof.

The phrase "server board carousel" or "carousel" may refer to round structure for mounting of, but not limited to or all-inclusive of support, server boards, heat exchangers and power sources.

The phrase "power source" may refer to a source of power to one or more of a marine subsea data vessel cluster, a marine subsea data vessel cluster array, a marine subsea data vessel, a data server, a server board, and a server board carousel.

The phrase "fan" refers to a system that provides air circulation for cooling of server boards by pushing or pulling air through a heat exchanger, or within an interior space.

The phrase "propulsor" refers to a system that provides fluid circulation for cooling of server boards by pushing or pulling fluid through a heat exchanger, or within an interior space.

The phrase "internal heat exchanger" refers to an air to liquid heat exchanger, or a liquid to liquid heat exchanger, or a nucleate boiling phase change heat exchanger, or an elemental heat exchanger, or any other type of heat exchanger (e.g. a radiator) inside a marine subsea data vessel that transfers heat from a component.

The phrase "coolant pump" refers to a pump for circulating liquid coolant.

The phrase "coolant piping" refers to a conduit for circulation of liquid coolant.

The phrase "pressure regulator" refers to a system for regulating pressure within a given space. In embodiments, a pressure regulator refers to a system for regulating the internal pressure of the marine subsea data vessel within the interior space.

The phrase "communications interface" refers to a system or device that serves as a communication hub between the marine subsea data vessel, docking station, other marine subsea data vessels, and a land-based data source or requestor.

The phrase "electrical and data cabling" refers to a system or device that routes electrical power and data signals throughout the marine subsea data vessel, the docking station, other marine subsea data vessels and a land-based data source or requestor.

The phrase "depth regulator" refers to a device or system that provides active or passive depth regulation of the marine subsea data vessel, docking station, marine subsea data vessel cluster, or marine subsea data vessel cluster array.

The phrase "docking station" and "chamber" refers to a structure for joining marine subsea data vessels together into a clustered marine subsea data vessel. In addition to the structure the docking station may include, but not be limited to or all-inclusive of a common external heat exchangers, power distribution network and data cabling, power back-up and conditioning system, networking and communications equipment, coolant pumps, coolant piping, depth regulator, seabed mooring system and a dynamic umbilical connection to the main subsea power and data cable to shore.

The phrase "external heat exchanger" may include a liquid to liquid heat exchanger on the exterior of the docking station, or marine subsea data vessel, or outer shell thereof, which transfers the data vessel interior heat by liquid coolant to an external heat exchanger in the surrounding medium.

The phrase "power distribution network and data cabling" includes a device or system that routes electrical power and data signals throughout the docking station, to the subsea data vessels, and/or to land-based data or power sources and requestors.

The phrase "power back-up and conditioning system" may include an uninterruptable power supply and batteries to maintain power quality and a back-up power supply.

The phrase "networking and communications equipment" may include communication equipment for the collection of data from the subsea data vessels and transmission to shore side facilities.

The phrase "seabed mooring system" may include a device or system of system of lines, connections and anchors for fixing the docking station, or marine subsea data vessel, or marine subsea data vessel cluster, in position with respect to the seabed.

The phrase "umbilical" may include a conduit for drawing cool medium from a depth below the marine subsea data vessel, marine subsea data vessel cluster, and/or docking station.

The phrase "dynamic umbilical" may also refer to electrical power and data transmission cable running from the docking station to the seabed main subsea power and data cable.

The phrase "main subsea power and data cable" may refer to seabed laid electrical power and data transmission cable connecting all docking station dynamic umbilical to shore side facilities.

FIG. 1 depicts an exemplary block diagram of a marine subsea data vessel 100, in embodiments. Marine subsea data vessel 100 includes, for example, at least one data server 102, formed from one or more server boards 103, a power source 104, and a communications interface 106. Certain embodiments may additionally include one or more of a processor 108, a heat exchanger 110, a pressure regulator 112, and a depth regulator 114. Communications interface 106 may be a network router implementing one or more of wired and wireless communications protocols including, but not limited to wireless cellular links including 3G, 4G, 5G, LTE, LTEU, LTE Advanced, or other cellular connectivity protocols including those using satellite, line of sight (3.3 and 3.8 GHz) satellite, WiFi, balloon or solar/microwave beam powered drones and distributed generation. Communications interface 106 enables data transmission from and to data vessel 100.

Figure 2:
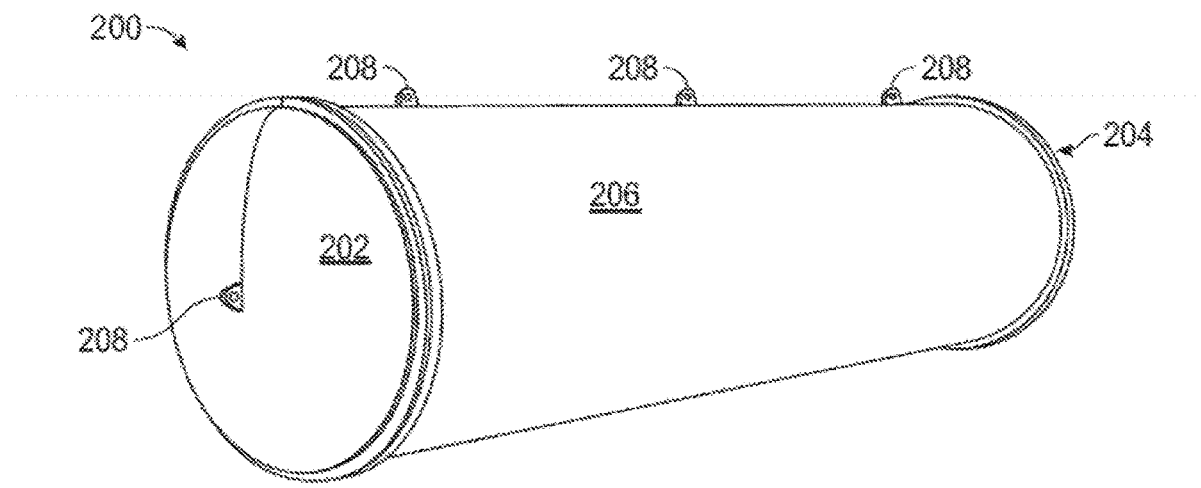
FIG. 2 depicts an exemplary marine subsea data vessel, in embodiments.

FIG. 2 depicts an exemplary marine subsea data vessel 200, in embodiments. Marine subsea data vessel 200 is an example of marine subsea data vessel 100. Marine subsea data vessel 200 is shown with an outer shell including a first endcap 202, a second endcap 204, and an outer shell portion 206 connected thereto. Outer shell portion 206 may be hydrostatically sealed to each of endcaps 202, 204. Moreover, one or both of endcaps 202, 204 may include a hinge (not shown) providing access into marine subsea data vessel 200. In embodiments, data vessels which function vertically in the water column are designed to have the center of buoyancy above the center of mass to provide top up positioning.

Outer shell 206, in embodiments, may include one or more structural radial rings and/or one or more longitudinal stiffeners. Such rings or stiffeners, in embodiments, may also act as heat sinks. The data vessel 200 may be pressure compensated with a pressure regulator 112 so the coolant is positively biased to the exterior, to wick out the cooling fluid, if necessary, and prevent ingress/contamination from the external medium (e.g. seawater).

The marine subsea data vessel 200 may be sealed for an extended period (i.e. a "lights out" facility) and powered externally from a variety of energy sources. The form factor of a marine subsea data vessel 200 could accommodate 300 kW of data server capacity within a standard shipping container size based on a closed, dual loop heat exchanger using the COTS air-cooling approach and 28U server board racks. By using the elemental cooling approach, such as that discussed with reference to FIG. 10, below, the data server capacity of the data vessel could be in the range of 800 kW. Advanced subsea data vessel topologies as discussed further below with respect to FIG. 11, incorporate liquid-liquid cooling approaches in a carousel server board format and could attain computational densities exceeding >1 MW.

The endcaps 204, 208 of the standard marine subsea data vessel 200 would contain wet or dry connect cable connectors to allow fiber optic, Ethernet, electrical, heat sink and instrumentation connections. Additionally, connections for cooling circuit tubing and ports for vacuum purging and nitrogen backfill would be contained in either domed or flat endcaps 202 and 204.

In embodiments, marine subsea data vessel 200 may further include attachments 208 for attaching to a docking station, mooring lines or power sources; other vessels, systems, or devices or to form a marine subsea data vessel cluster on a docking station. More or fewer attachments 208 may be utilized without departing from the scope hereof.

Figure 3:
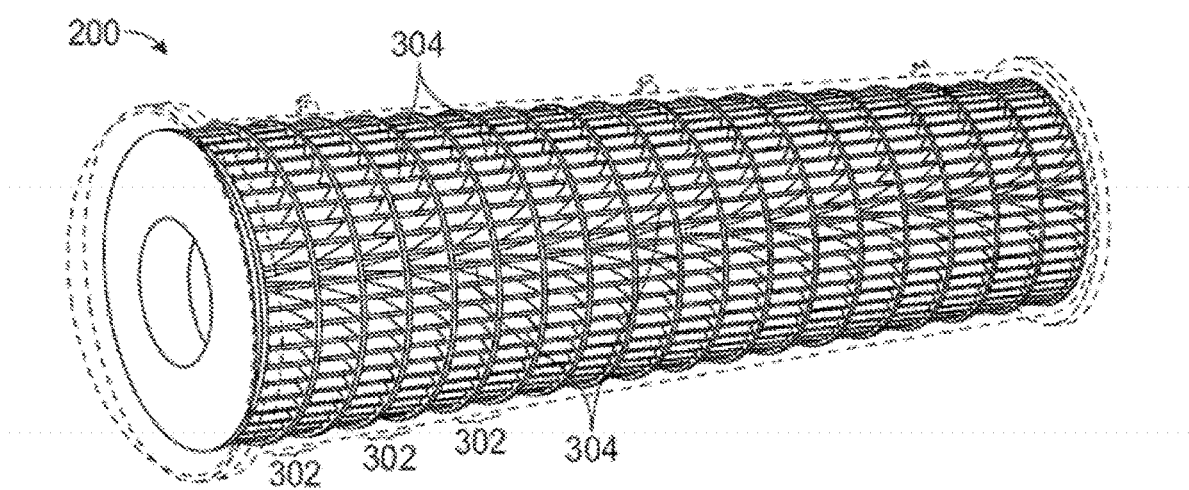
FIG. 3 depicts the marine subsea data vessel of FIG. 2, with each endcap and housing portion made transparent for viewing within the marine subsea data vessel, in an embodiment.

FIG. 3 depicts the marine subsea data vessel 200 with each endcap 202 and housing portion 206 made transparent for viewing within the marine subsea data vessel 200, in an embodiment. As depicted, marine subsea data vessel 200 includes a plurality of server board carousels 302, each including server boards 304. For example, one or both of endcaps 202, 204 may include a manhole hatch to allow access to the high server board density of the carousel configuration, via an interior open shaft or plenum (discussed below) which is not possible with the standard 12-42U rectangular data server racks.

It should be appreciated that there may be more or fewer server board carousels 302 than illustrated. Moreover, it should be appreciated that there may be more or fewer server boards 304 on each carousel 302 than illustrated. Moreover, in embodiments, server boards 304 are standard to conventional COTS server racks, or in server board(s), or a combination thereof. For clarity, not every server carousel 302 or server board 304 is labeled within FIG. 3.

In embodiments, each server board 304 may be connected via a direct current (DC) bus topology that may facilitate the integration of battery energy storage, while improving energy use efficiencies up to 35% by eliminating double ended power conversions of conventional DC systems. This approach would integrate a DC bus to deliver 12 volts direct current (VDC) to the server boards 304, or may be changed to an optimal DC voltage based on the system requirements. The DC bus may be connected to a transformer connected to but is not limited to, a high voltage direct current (HVDC) transmission and delivery system.

Figure 4:
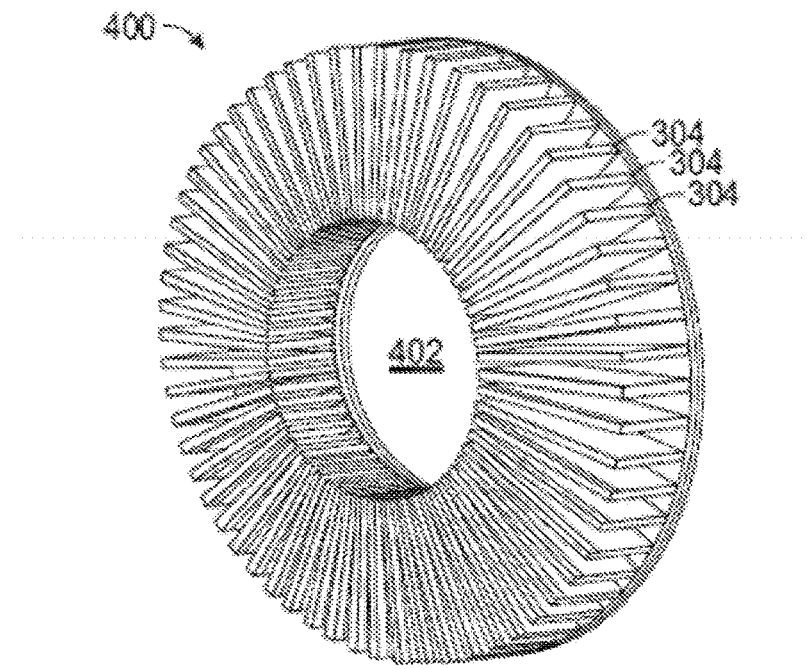
FIG. 4 depicts an exemplary server board carousel for use with the marine subsea data vessels of FIGS. 1-3, in an embodiment.

FIG. 4 depicts an exemplary server board carousel 400, in an embodiment. Server board carousel 400 is an example of server board carousel 302. As shown, server board carousel 400 includes sixty server boards 304 equally spaced around an interior plenum 402. Again, there may be more or fewer server boards 304 per carousel 400 without departing from the scope hereof.

In embodiments, the marine subsea environment necessitates a round/cylindrical pressure vessel that is resistant to hydrostatic buckling. Standard, off the shelf, server board racks which are rectangular box like structures do not adapt efficiently to the cylindrical form. A carousel approach, such as that shown in FIG. 4, whereby the server boards 304 are fanned radially outward allows for increased computational densities, interior accessibility and improved cooling topologies. Standard COTS hardware using air cooling has practical limits of 37 kW per a 42U rack with inefficient air circulation to each server board within the rack.

Embodiments herein having a carousel form, however, may have interior plenum 402 accessible by marine hatch door and an inner diameter wide enough for manned access, cooling fans (if necessary) and server board accessibility and removal. Certain embodiments herein, require non-COTS rack topologies to allow for the accessibility and optimized cooling, facilitated by the carousel approach. Much greater cooling is possible with various heat exchange embodiments presented herein, such as the liquid-liquid approach of complete dielectric liquid server board immersion which improves heat dissipation by as much as 1000× over air heat transfer, enabling a denser concentration of server boards in the carousel arrangement, that could not be accomplished with the air cooled system used in rectangular rack topologies.

Figure 5:
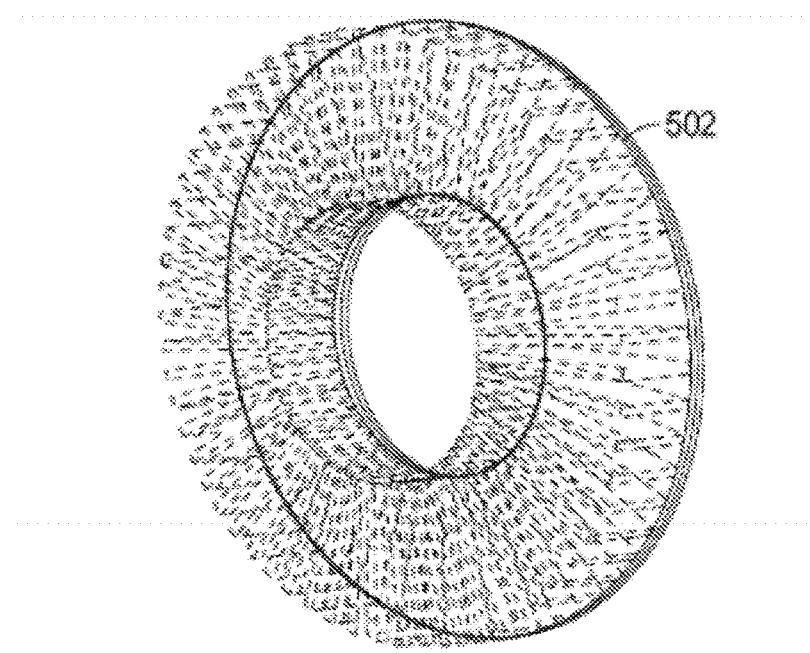
FIG. 5 depicts the server board carousel of FIG. 4, with each server board made transparent to view support therefore.

FIG. 5 depicts the server board carousel 400 of FIG. 4, with each server board 304 made transparent to view support 502. Support 502 allows for mounting of each server board 304 according to the desired configuration (i.e. in an equally spaced carousel formation). It should be appreciated that each server board 304 may be mounted with unequal spacing as well. For example, where thermal conductivity is inconsistent within the marine subsea data vessel, it may be desirable to space the server boards farther apart to allow for greater thermal heat transfer. An optional gap may be included between server boards allowing for heat exchanger equipment, or other equipment necessary for operation of the marine subsea data vessel.

While the marine subsea data vessel may be designed to be sealed for the operating life of the servers, the interior plenum 402 may be sized and shaped to allow operator entry within the marine subsea data vessel 200 such that the operator can perform maintenance and other work on various components of the marine subsea data vessel 200.

The above discussed carousel configuration having inner plenum 402 provides significant benefits. For example, this topology allows increased accessibility to any server board 304 from inside carousel 302. This is significantly advantageous over the alternating back to back, rectangular, 28U to 42U server board racks, where a server board failure may require removal of several racks to gain access and may likely result in the subsea data vessel being brought back to shore, whereas the carousel stack could be maintained at sea.

The vertical carousel form provides a passive method of driving air circulation, by the cooler air entering from the plenum, expanding the air as heat is transferred from the server boards, which have a widening aperture away from the plenum, thereby inducing airflow and internal circulation. With standard rectangular 28U to 42U box racks, the airflow would not have expansion induced circulation due to the parallel server boards. Additionally, for a given diameter of the carousel 302, more server boards 304 may be packaged in this radial configuration per unit of carousel stack length, versus standard rectangular racks, while improving cooling paths, aiding flow and increasing computational density.

Figure 6:
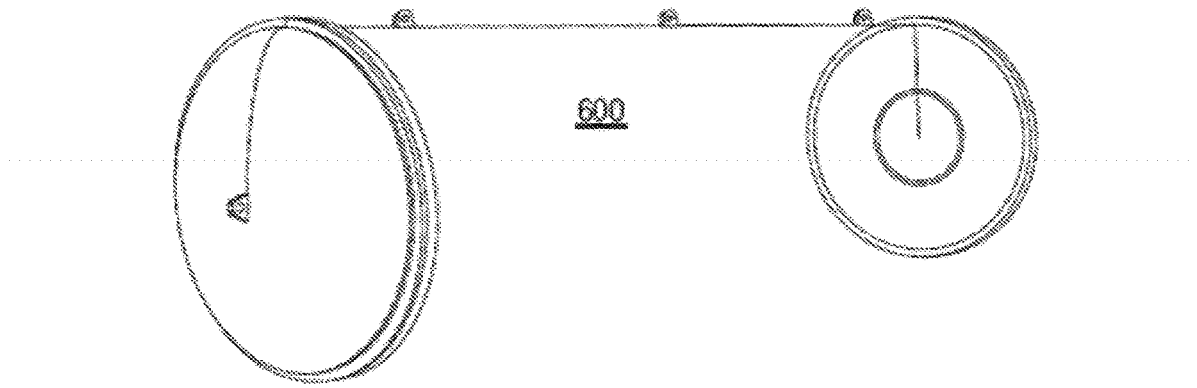
FIG. 6 depicts additional exemplary dimensions of the marine subsea data vessel of FIG. 2.
Figure 7:
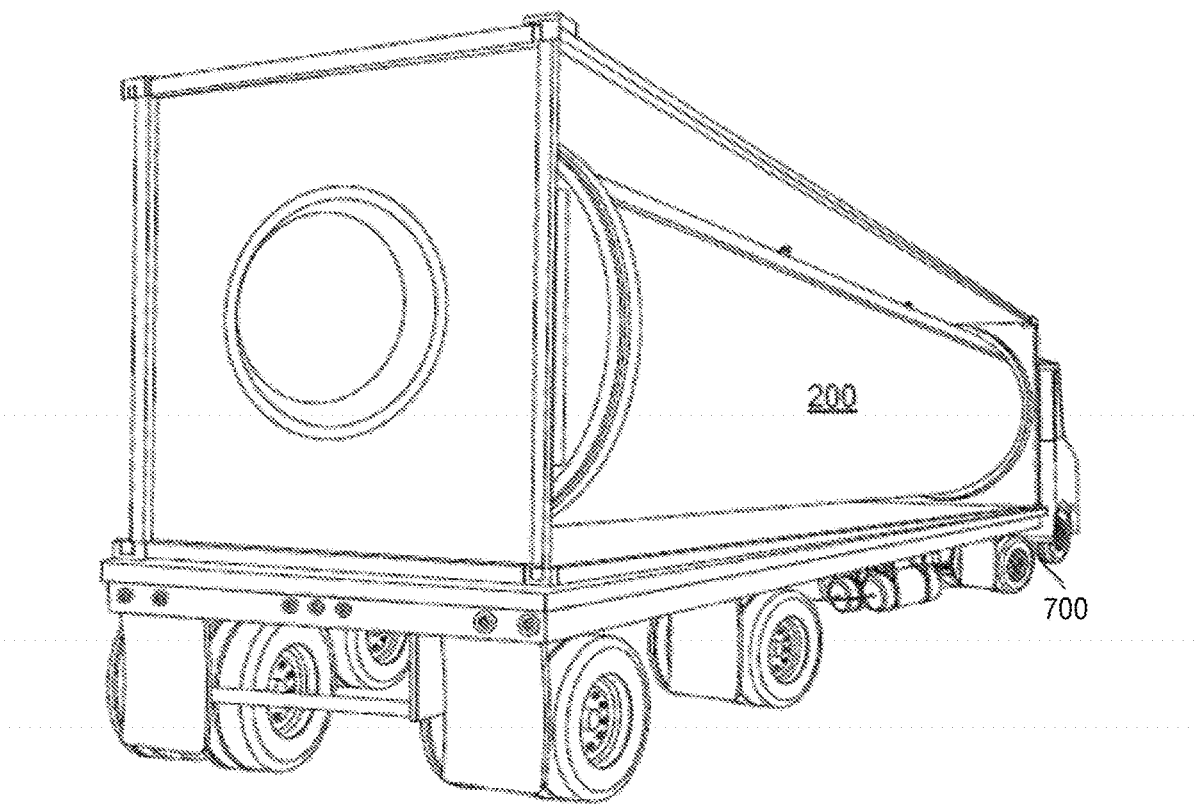
FIG. 7 depicts the marine subsea data vessel of FIG. 2 being transported by a standard tractor trailer.

FIG. 6 depicts additional exemplary dimensions of marine subsea data vessel 200. For example, the marine subsea data vessel may have a length 600 equal to a standard 40 foot shipping container (12.2 meters) and where larger road transportable dimensions can be permitted, greater computational densities can be achieved. For example, FIG. 7 depicts marine subsea data vessel 200 being transported by a standard tractor trailer 700. The design of standardized marine subsea data vessel embodiments as presented above allows for a standard road transportable vessel and a scalable design capable of deployment around the world avoiding costly customization and deployment delays. The marine subsea data vessel is rapidly dispatchable and serves as a distributed modular data center that can be deployed and scaled quickly near the user base. In one example, the marine subsea data vessel has a height of 8.6 feet, a width of 8 feet, and a length of 10, 20, or 40 feet depending on the standardized tractor trailer. The marine subsea data vessel may have other dimensions without departing from the scope hereof.

Figure 8:
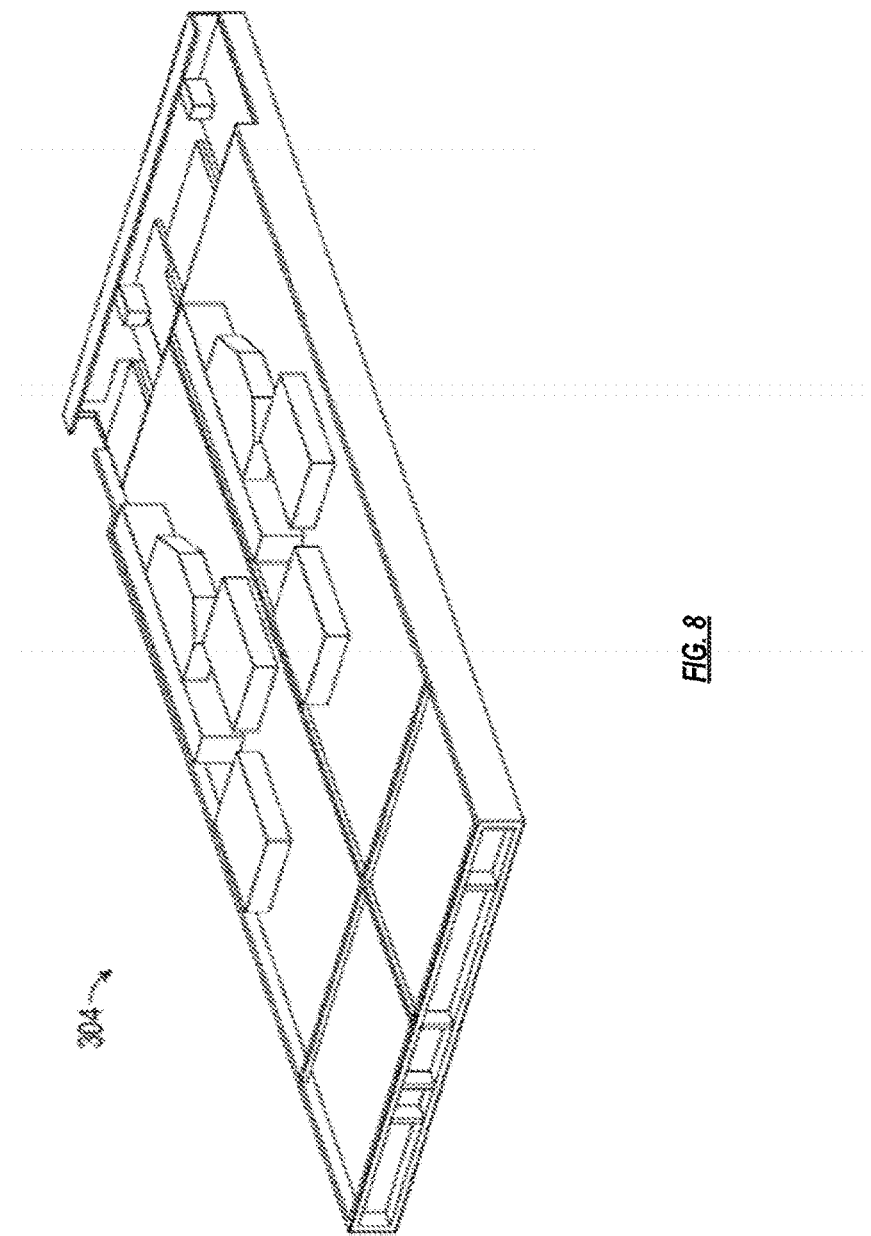
FIG. 8 depicts a typical server board of FIG. 3 in further exemplary detail complete with a processor(s) and other electronic components, in embodiments.

FIG. 8 depicts server board 304 in further exemplary detail, in embodiments. Server board 304 is shown in FIG. 8 having a length 802 of 912.22 mm, a width 804 of 444.8 mm, and a thickness 806 of 42.95 mm. It should be appreciated that these dimensions are exemplary and not limiting in scope. Server board 304 is also shown having optional coating 808. Coating 808 acts to seal the server board 304 such that it can withstand not only liquid immersion, but in certain embodiments liquid immersion at depths to counter the effects of hydrostatic pressure. The internal components of server board 304 may be made further pressure resistant, for example, by eliminating air filled spaces (e.g. via potting in phenolic resin) within capacitors and other electrical components during the coating process.

By modifying server board 304 to be pressure tolerant to full ocean depth, the 1000X cooling benefit of liquid versus air heat flux may be realized, thus improving computational densities and $/W reductions in capital expenditure. Moreover, in embodiments with such coating 808, internal cooling fans may be eliminated and replaced by a process of natural (free) liquid convection whereby circulation is enabled by the heat pickup off of heat generating components such as the CPU and power converters.

Server board 304 without coating 808, of FIG. 8, is an embodiment where server board 304 may be a ½ U, 1U, 2U, etc. without coating 808 such that standard COTS server boards (e.g. server blades) may be utilized in the carousel configuration as discussed above thereby allowing access to each server board via interior plenum 402.

Figure 9:
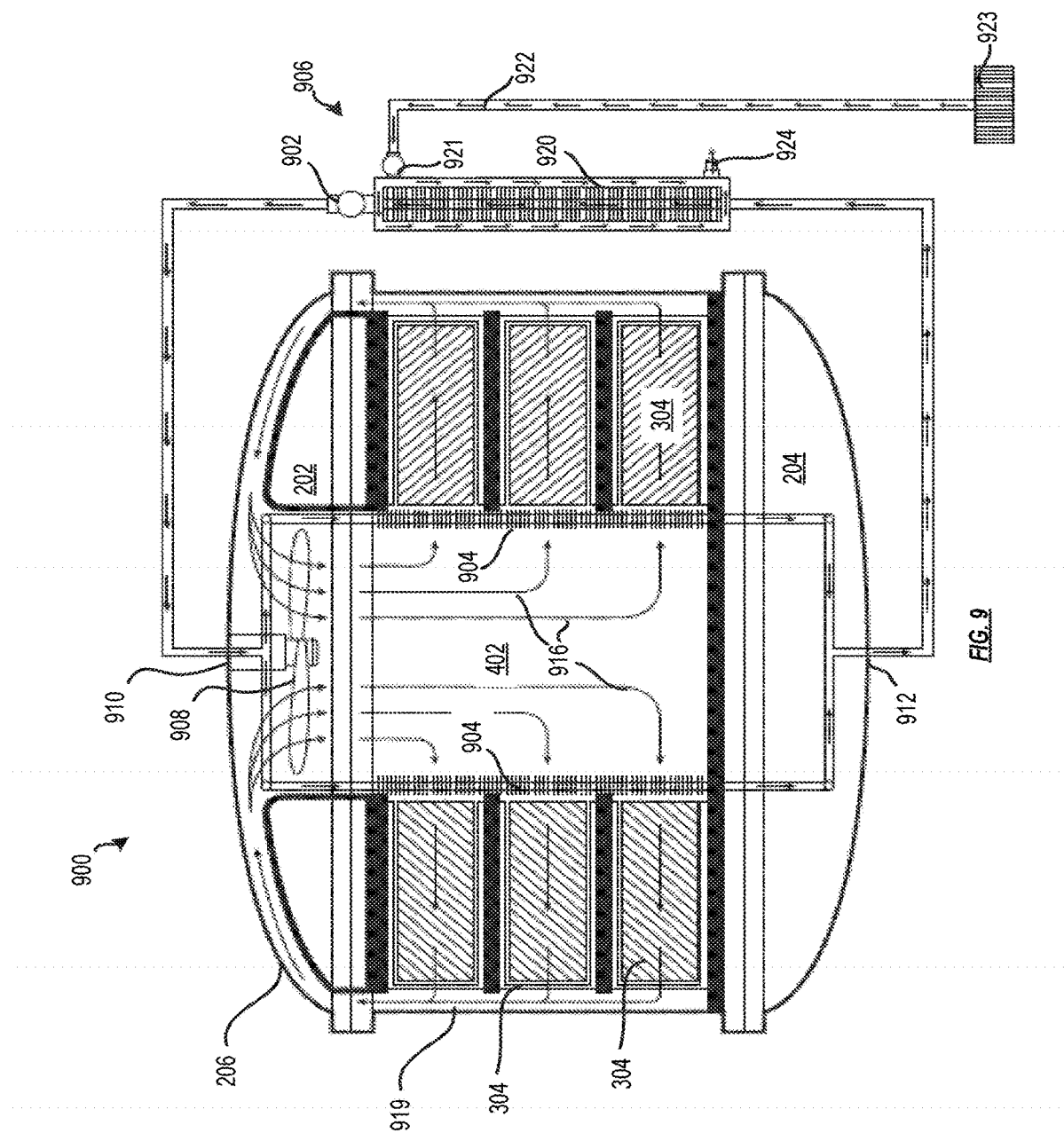
FIG. 9 depicts an exemplary coolant fluid circulation heat exchanger and fan for use within the marine subsea data vessels of FIGS. 1-8, in an embodiment.

Heat Exchanger Embodiments:

FIG. 9 depicts an exemplary coolant fluid circulation heat exchanger 900 for use within marine subsea data vessel 100, in an embodiment. Heat exchanger 900 is, for example, a first embodiment of heat exchanger 110, of FIG. 1. Heat exchanger 900 implements, for example, a single-phase air-liquid cooling, or single-phase liquid-liquid cooling topology to disperse heat generated by the plurality of server boards to exterior of the data vessel.

Heat exchanger 900 is illustrated as implemented within marine subsea data vessel 200, including outer shell portion 206, and a plurality of server boards 304 in a carousel formation including interior plenum 402 and air/fluid gap 919. Gap 919, within FIG. 9 is illustrated forming a return air or liquid to the plenum around the outer perimeter of the server board carousel stack.

Heat exchanger 900 includes at least one coolant pump 902, at least one internal heat exchanger 904, at least one external heat exchanger 906, and an internal circulation fan 908. Coolant pump 902 (e.g. a prime mover) operates to circulate coolant in a cycle through a heat exchanger inlet/manifold 910 into internal heat exchanger 904, through which the interior air/fluid of the vessel flows, to be cooled and directed to cool the server boards. The heat exchanger outlet 912 through vessel outer shell 206 transmits the fluid into external heat exchanger 906, cooling the fluid and circulating the fluid back through inlet/manifold 910, driven by coolant pump 902. Heat exchangers 904 are, for example, positioned to concentrate the cooled air/fluid flow toward the server board 304 for heat removal. Heat exchanger 904 may be, for example, a concentric cylindrical heat exchanger in the inner diameter of the carousel of server boards whereby the air warmed by the server boards is cooled as it impinges on the outer shell 206 or in a liquid-liquid exchange the heat exchanger may be removed and the liquid dissipates heat to the outer shell 206, circulating by natural convection. Heat exchanger 904 may also be placed near the server board carousel outer diameter or any other location within marine subsea data vessel 200 without departing from the scope hereof.

The internal circulation fan 908 operates while coolant pump 902 cycles liquid coolant in the above discussed closed-loop circuit. Internal circulation fan 908 may be a fan that operates to cycle air, or a propulsor that operates to cycle fluid, in a toroidal circulation pattern with the air/fluid rising on the inner shell wall, and the cooled air/fluid descending in the plenum within the marine subsea data vessel. For example, internal circulation fan 908 may be mounted within one of endcaps 202, 204 and push air 916 into the plenum and around and over the server boards 304. As another example, internal fan 908 may be implemented as a barrel fan concentric to and inside the plenum, and/or by using the thermal expansion of air/fluid by heat of the server boards within the carousel where widening aperture between the server boards and the convective flow to propel air/fluid circulation. The flowing air/liquid 916 is incident on heat exchanger 904 cooling the air/liquid to pass over the heated server boards 304 extracting heat thereby. Heated air circulation is driven by the fan, the air expansion in the widening gap between server boards and the convection force upward along the vessel wall, exchanging some of the heat from the air through the outer shell 206 to the surrounding, external water. Heat extracted from the internal heat exchangers by the coolant is delivered to the external heat exchanger 906, to be re-cooled by the surrounding seawater.

FIG. 9 also depicts additional elements that may be associated with external heat exchanger 906, in embodiments. For example external heat exchanger 906 may include enclosure jacket 920, raw seawater inlet pump 921, umbilical pipe 922 and raw seawater inlet strainer 923. Inlet pump 921 draws cooler seawater from greater depths through umbilical pipe 922 and inlet strainer 923. Inlet strainer 923 prevents marine organisms and debris from being drawn into umbilical pipe 922. Enclosure jacket 920 has outlet 924 to discharge the water heated by passing over external heat exchanger 906.

Coolant discussed above with respect to heat exchanger 900 may be water, a water/coolant mix, air, a di-electric medium, a biodegradable synthetic single phase hydraulic fluid such as Exxon Mobil or Royal Purple, 3M™ Novec™ for two-phase nucleate boiling considerations or 3M™ Fluorinert™ electronic immersion liquids FC-72, FC-86 and FC-87.

In certain embodiments, heat exchanger 904 and internal circulation fan 908 may be removed. For example, if the server boards 304 are modified, such as discussed above with respect to FIG. 8, the interior space within data vessel could be filled with a dielectric fluid. Accordingly, coolant pump 902 could circulate this internal dielectric through the vessel shell 206 and into and through the external heat exchanger 906. This embodiment would use conduction though the outer shell 206, driven by natural convection of fluid inside the vessel and an external heat exchanger (or one encapsulated on the outer surface of the vessel shell 206) to circulate the dielectric fluid medium to dissipate heat to the external seawater. This embodiment eliminates costs and maintenance requirements associated with heat exchanger 904 and internal circulation fan 908. A cooling loop that pumps the coolant to the external heat exchanger to promote internal self-convection and conduction through the vessel outer shell 206 would produce a lower powered and quieter system.

In either embodiment, however, for near surface applications an umbilical or cooling line (e.g. umbilical pipe 922 and inlet pump 921 and inlet strainer 923) may be used to bring cooler seawater from depth into a secondary loop to chill the di-electric medium/coolant discussed with respect to FIG. 9.

Figure 10:
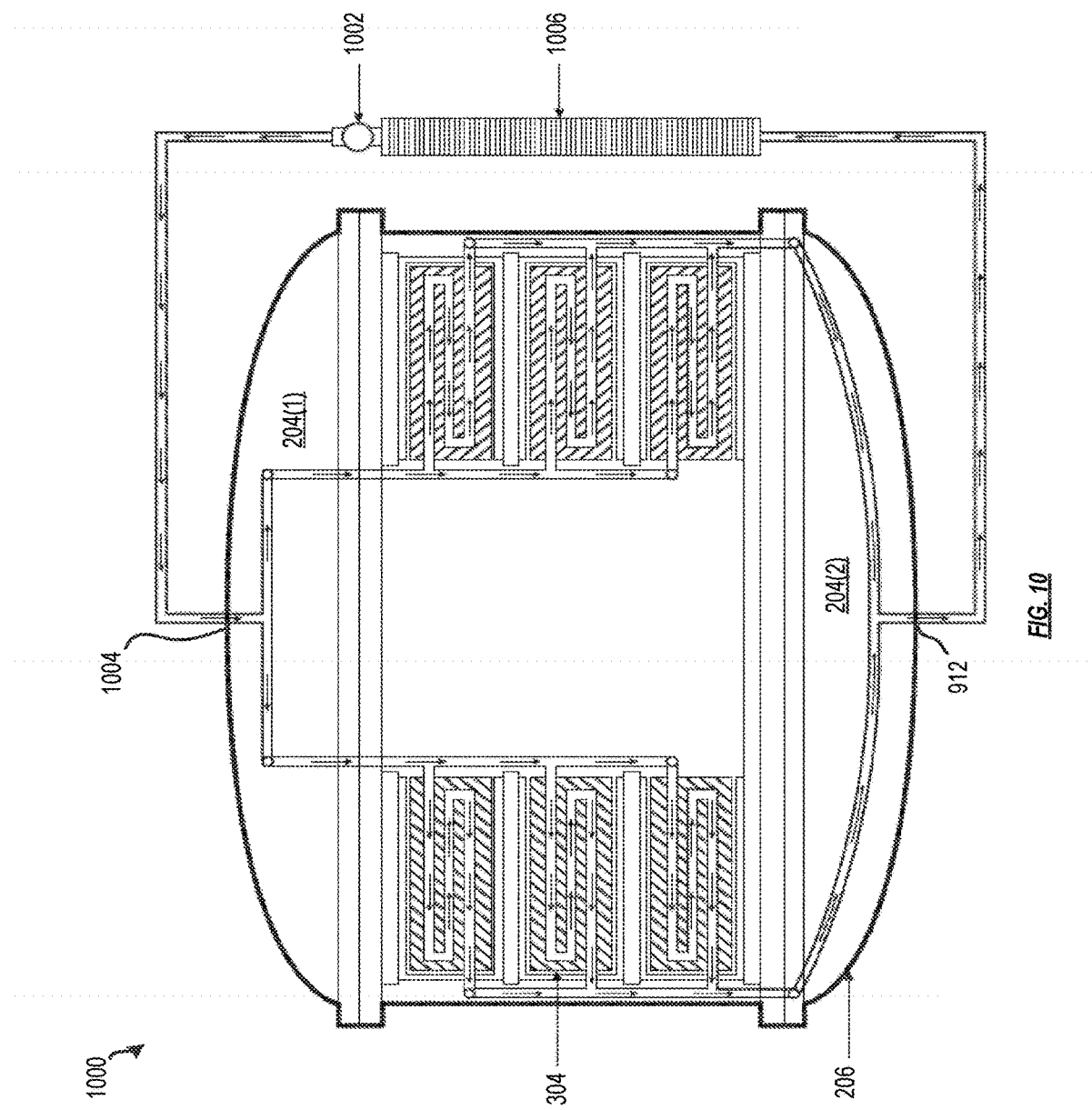
FIG. 10 depicts an exemplary elemental heat exchanger for direct conduction of heat from server boards to fluid coolant within the marine subsea data vessels of FIGS. 1-8, in an embodiment.

FIG. 10 depicts an exemplary elemental heat exchanger 1000 for use within marine subsea data vessel 100, in an embodiment. Heat exchanger 1000 is, for example, a second embodiment of heat exchanger 110, of FIG. 1. Heat exchanger 1000 is similar to heat exchanger 900, but further includes a manifold to distribute cooling fluid through tubing in direct contact with server boards as a conductive heat exchange mechanism. Accordingly, heat exchanger 1000 includes one or more of a coolant pump 1002, an external heat exchanger 1010, an inlet/manifold 1004, heat exchanger outlet 912, enclosure jacket 206 and raw seawater inlet pump 921, umbilical pipe 922 and raw seawater inlet strainer 923 not shown although structured and functioning as described above with reference to FIG. 9. Particularly, however, heat exchanger 1000 of FIG. 10 is shown without internal heat exchanger 904, internal circulation fan 908, enclosure jacket 920, raw seawater inlet pump 921, umbilical pipe 922 and raw seawater inlet strainer 923.

As shown in FIG. 10, manifold heat exchanger 1000 includes a manifold heat exchanger pump 1002 cycling fluid into an interior manifold 1004 through a manifold inlet 1006, and out of the interior manifold 1004 via a manifold outlet 1008. The manifold 1004 may comprise coolant pipes directly coupled to one or more of server boards 304. Accordingly, direct heat transfer from server boards 304 is made to the coolant fluid flowing through manifold coils in contact with the server boards to affect thermal transfer by conduction. Manifold 1004 may pass through the server board carousel 302 holding the server boards 304 in a continuous circulation pattern. The coolant therein chills as it reflows through manifold heat exchanger driven by pump 1002.

It should be appreciated that, in certain embodiments, the manifold heat exchanger pump 1002 is the same as the coolant pump 902 such that the coolant passing through manifold 1004 is cooled directly via seawater through external heat exchanger 1010, which may be the same as heat exchanger 906. This approach to heat transfer by thermal conduction would allow cooling on the order of 80 kW/42U rack and 800 kW per marine subsea data vessel 100. It should be appreciated that coolant pump 902 and 1002 may be located internally or externally to the marine subsea data vessel. However, locating the pump externally may provide additional heat reduction by eliminating internal heat emitted by pump 902 and 1002.

Figure 11:
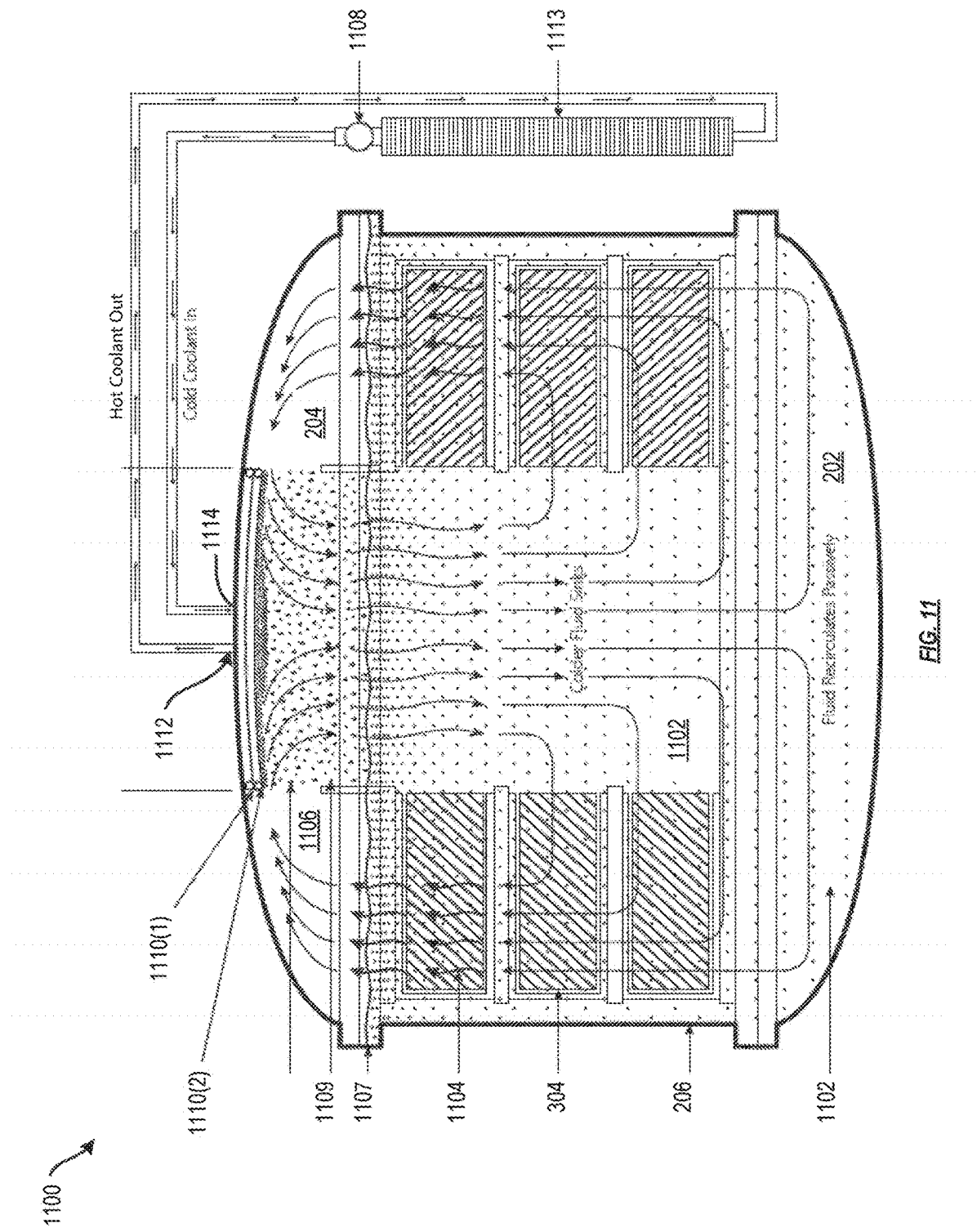
FIG. 11 depicts an exemplary nucleate boiling phase change heat exchanger for use in the marine subsea data vessels of FIGS. 1-8, in an embodiment.

FIG. 11 depicts an exemplary nucleate boiling phase change heat exchanger 1100 for use in marine subsea data vessel 100, in an embodiment. Heat exchanger 1100 is, for example, a third embodiment of heat exchanger 110, of FIG. 1. Heat exchanger 1100 system implements a two-phase, liquid-liquid cooling topology, such as a nucleate boiling phase change topology. Heat exchanger 1100 operates by immersing, and thereby thermally quenching, each server board 304 within an immersion fluid 1102 such as 3M™ Novec™ or other suitable dielectric immersion fluid. Heat generated by the server boards 304 then promotes liquid vaporization 1104 and the vapor 1104 rises to an air pocket 1106 defined by the fluid surface 1107 transitioning to the vapor/air pocket 1106. Air pocket 1106 is shown, for example, located within gap 919 which has been positioned at the top of data vessel 100 at one of the endcaps (e.g. endcaps 202, 204).

Located at the inside top of air pocket 1106 is a condenser coil or plate 1110 connected by tubing to an exterior coolant pump 1108 and heat exchanger 1113. As the vaporized coolant 1104 rises, the hot vapor air pocket 1106 has condensation form on the condenser plate 1110 (which may include one or more condenser plates 1110(1) and 1110(2) which are cooled via coolant being pumped by coolant pump 1108. Condensation falls away as chilled fluid droplets 1109. Air pocket 1106 may be near vacuum or filled with a combination of gases. The coolant is cycled from coolant pump 1108, through the condenser 1110, out a heat exchanger outlet 1112 located through outer shell 206, through an external heat exchanger 1113 and back through pump 1108 via inlet 1114. External heat exchanger 1113 is similar in structure and function to that of external heat exchanger 906 and 1010 discussed above with respect to FIGS. 9-10. The chilled coolant fluid droplets forming on the condenser plate drop to the surface 1107 of the fluid coolant in the surface area of the plenum. This chilled coolant has greater density than the surrounding coolant and thus sinks, while the coolant fluid in contact with the server boards rises along with the bubbles formed by coolant vaporization. This process of thermally driven circulation in heat exchanger 1100 may improve server board cooling efficiency 1000× over air heat exchanger methods.

Figure 12A:
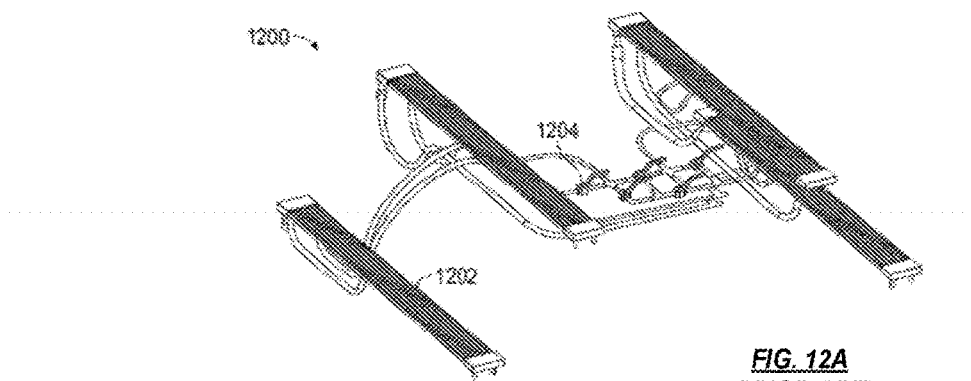
FIG. 12A depicts an exemplary marine keel cooler external heat exchanger, in an embodiment.

FIG. 12A depicts one exemplary external marine keel cooler heat exchanger 1200, in an embodiment. External heat exchanger 1200 is an example of external heat exchangers 906, 1010, 1113, discussed above with regards to FIGS. 9-10. External heat exchanger 1200 includes a plurality of marine keel coolers 1202 coupled in series, or in parallel to various valves 1204 for controlling flow therein. One or more of marine keel coolers 1202 may be coupled to an inlet or outlet (e.g. vessel inlet 910, inlet 1114, inlet heat exchanger outlet 912, and heat exchanger outlet 1112) within the internal portions of the above discussed heat exchangers. Marine keel coolers 1202 may be positioned laterally along outer shell 206, such as perpendicular to length 600.

Figure 12B:
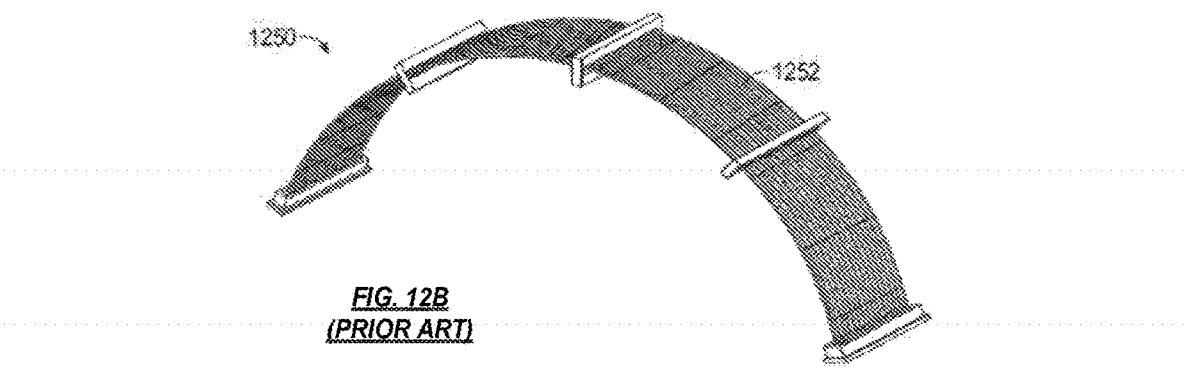
FIG. 12B depicts an exemplary external mini-tube heat exchanger, in an embodiment.

FIG. 12B depicts one exemplary external mini-tube heat exchanger 1250, in an embodiment. External heat exchanger 1250 is an example of external heat exchangers 906, 1010, 1113, discussed above with regards to FIGS. 9-10. External heat exchanger 1250 includes one or more tubes 1252 coupled in series or in parallel. One or more of tubes 1252 may be coupled to an inlet or outlet (e.g. vessel inlet 914, inlet 1114, inlet heat exchanger outlet 912, and heat exchanger outlet 1112) within the internal portions of the above discussed heat exchangers.

Figure 13:
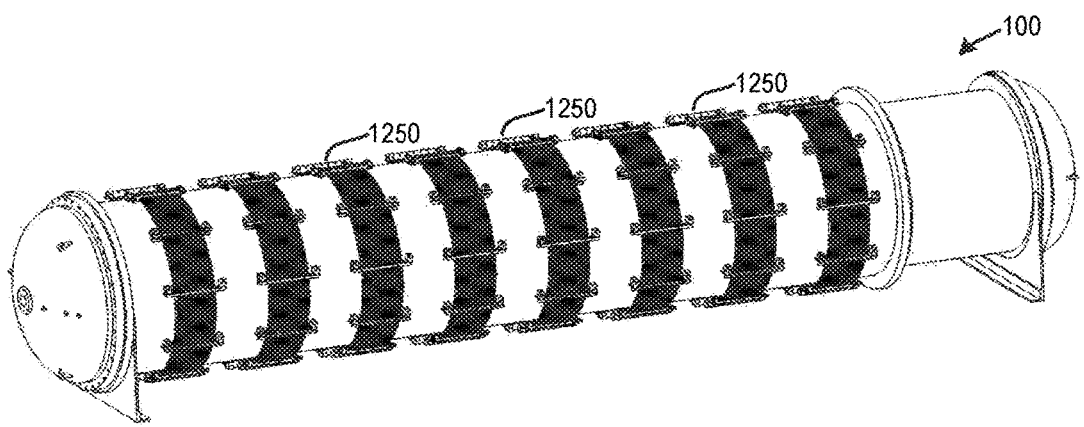
FIG. 13 depicts a plurality of external mini-tube heat exchangers wrapped around a marine subsea data vessel, in an example.

FIG. 13 depicts a plurality of heat exchangers 1250 wrapped around marine subsea data vessel 100.

The above discussed heat exchangers 900, 1000, 1100 provide significant benefits over conventional land-based, barge-based and semi submerged data centers. These heat transfer processes include, in a synergistic manner, conduction, closed loop dual heat exchanger, liquid-liquid exchanges, air expansion, forced and self-convection. The heat transfer mechanism is controlled by the three series (additive) thermal resistances: convection on inside, conduction through the vessel outer shell/skin and convection on the outside. Marine currents significantly enhance the subsea data vessel exterior cooling methods.

Concerning conduction, a demonstrated amount of heat dissipation through the vessel outer shell 206 via conduction serves to lower the temperature change (ΔT) across the server boards 304. It has been demonstrated that ~12.6% of the heat was dissipated through the vessel outer shell 206 in a liquid-air exchange, which is not possible through land-based or floating barge-based approaches which use an open loop, raw seawater, cooling system. Additionally, more heat is dissipated through the outer shell 206 in a liquid-liquid heat exchange giving the possibility of eliminating a cooling circuit with penetrations through outer shell 206 to an external heat exchanger and requisite instrumentation, automation and control, such as discussed below.

Submerged vessel 100 when deployed in a high flow speed marine current (tidal or ocean) environment presents a significant benefit in heat rejection through forced conduction and convection over the external heat exchanger surfaces (e.g. 906, 1113) or outer shell 206 where by heat transfer coefficients are doubled, as measured ~850 watts per square meter per degree centigrade (W/m$^2$-° C.) in stagnant water—as compared to 1500 W/m$^2$-° C. at 1.5 meters/second (mps) flow speeds. A substantial increase in the heat transfer coefficient (HTC) of the external heat exchanger is experienced as the ambient flow velocity increases from zero.

Figure 14:
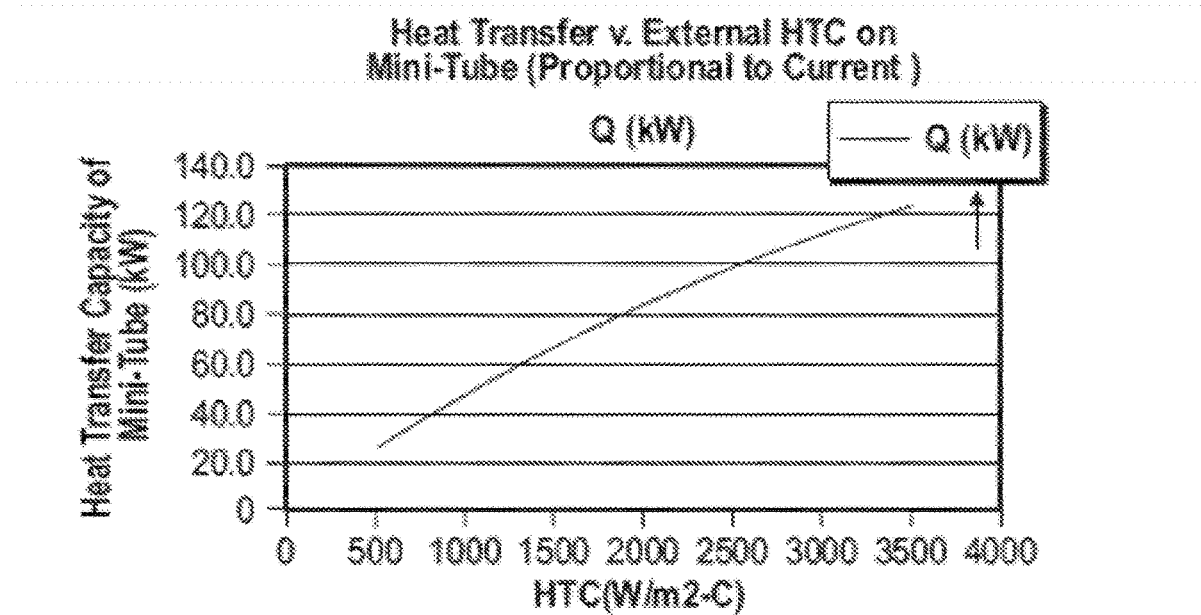
FIG. 14, for example, depicts heat transfer capacity versus external heat transfer coefficient (HTC) on the external heat exchanger of FIG. 12B, proportional to water current velocity, in one embodiment.

FIG. 14, for example, depicts heat transfer versus external HTC on external heat exchanger 1250, proportional to current, in one embodiment. With increased seawater current speed from 0 to 2 knots (0 to 1 mps) the heat exchanger size can be reduced to half, implying a doubling of the HTC. The improvement in the HTC is mostly realized in going from zero to some nominal velocity. Beyond that, the effect is less dramatic—i.e., increasing the velocity to say, 5 knots may only increase the HTC by 10%-20%.

Figure 15:
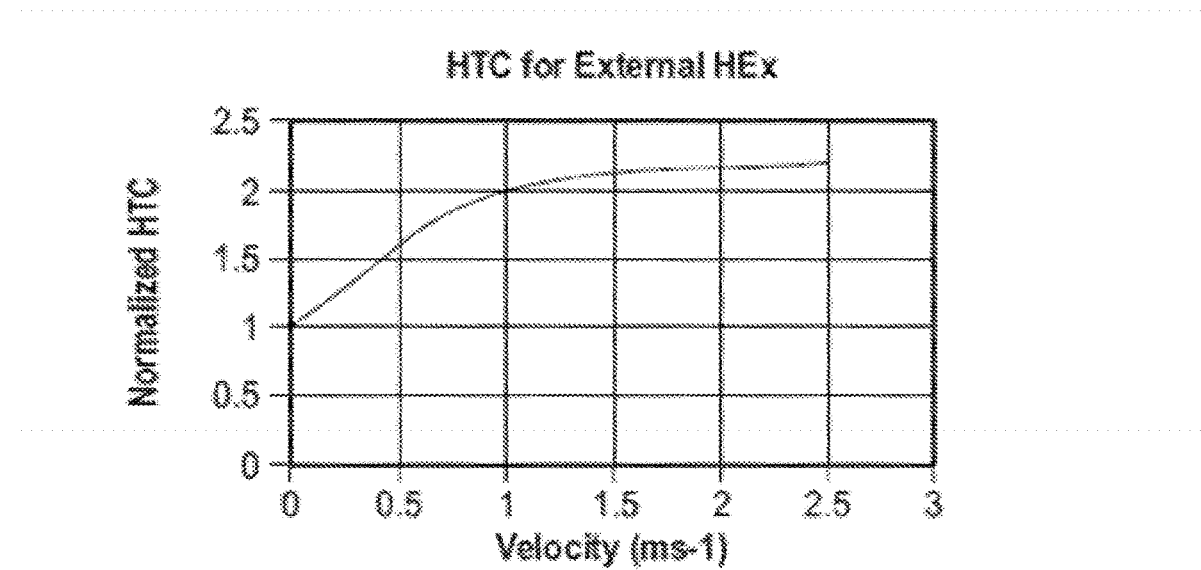
FIG. 15, for example, illustrates a graph of HTC for an external heat exchanger in relation to velocity of surrounding seawater.

FIG. 15, for example, illustrates a graph of HTC for an external heat exchanger in relation to velocity of surrounding seawater. In embodiments herein, flow across subsea data vessel 100 would improve heat dissipation conducted through the vessel outer shell 206 via higher external heat transfer coefficients. The higher external flow, while increasing heat transfer coefficients and heat dissipation also inhibits bio-fouling when used in conjunction with ablative anti-fouling paint.

For stagnant water conditions heat transfer phenomena such as self-convection over the heat exchangers enhances the heat rejection. This was demonstrated with external heat exchanger 1250 arrangement. For example, a typical experiment at maximum power would draw 19.33 kilowatts (kW) of electricity, all of which is converted to heat. With the water coolant recirculating at the maximum flow rate of 74 liters/minute, it was estimated that 87.4% of that heat (16.89 kW) transfers to the ocean via the external heat exchanger 1250; the remainder transfers directly through the vessel outer shell 206. As such, external heat exchangers may achieve greater efficiency if they are mounted to take advantage of self-convection. For example, keel coolers 1202 mounted such that the length thereof is in a vertical direction may achieve greater efficiency by taking advantage of the self-convection flow.

Figure 16:
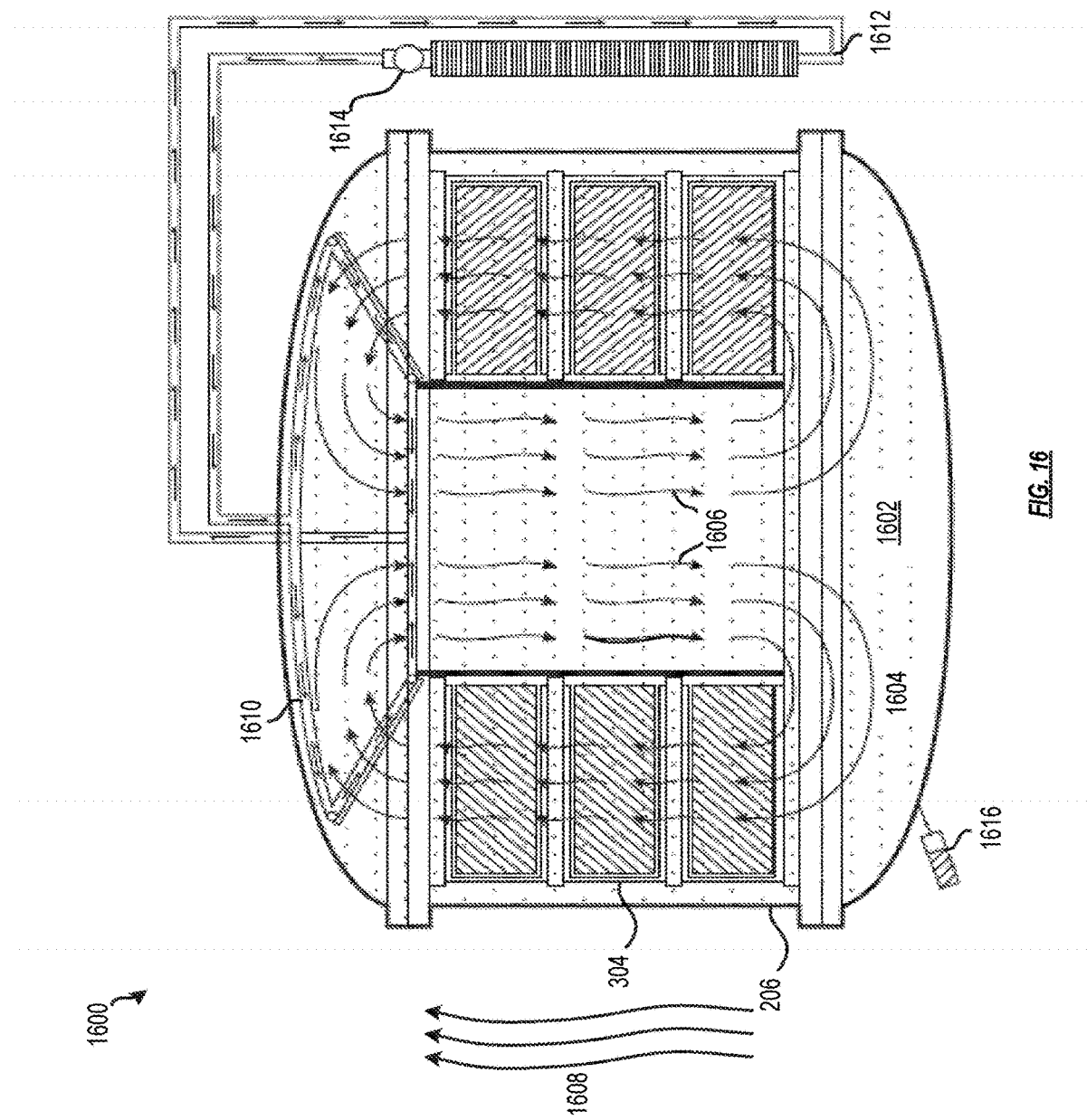
FIG. 16 depicts convective circulation of fluid through an internal heat exchanger in an exemplary heat exchanger for use in the marine subsea data vessels of FIGS. 1-8, in an embodiment.

FIG. 16 depicts an exemplary heat exchanger 1600 for use in marine subsea data vessel 100, in an embodiment. Heat exchanger 1600 is, for example, a fourth embodiment of heat exchanger 110, of FIG. 1. Heat exchanger 1600 operates, for example, according to a total immersion liquid-liquid cooling topology. In heat exchanger 1600, the inner space defined by outer shell 206 is filled entirely with a liquid coolant 1602, such as 3M™ Novec™, Royal Purple mineral oil or other liquid coolant. Server boards 304 and the server board carousel 302 may be modified (as discussed above) to withstand hydrostatic pressure and liquid immersion. Heat from server boards 304 generate a convectional current within liquid coolant 1602 as shown by arrows 1604 causing the heated coolant to rise in the periphery within the vessel, and dissipate heat through the inner heat exchanger 1610. It should be appreciated that inner heat exchanger 1610 and exterior heat exchanger 1612 are optional, particularly where a sufficient heat exchanger occurs at the outer shell 206. As the coolant 1602 cools by heat transfer to the inner heat exchanger 1610 (or to outer shell 206 and the surrounding medium), the denser chilled coolant 1602 then flows down the plenum to the bottom of the vessel via gravitational forces 1606 to then circulate back up and over the server boards heating the coolant and inducing convective circulation of the fluid. This convection flow 1604 directly cools the server boards.

This topology of heat exchanger 1600 further eliminates all active features of an open or closed dual loop cooling system by internal self-convection 1604 that circulates heat flow to the vessel shell 206 and dissipates it through the internal heat exchanger 1610 connected by piping to the external heat exchanger 1612. Coolant pump 1614 circulates coolant flow through internal heat exchanger 1610 and external heat exchanger 1612. Conduction through vessel outer shell 206 may be assisted by heat sink fins.

As the heat transfers from coolant 1602 to the outer seawater, natural convection 1608 is generated due to the seawater heating. Accordingly, heat exchanger 1600 benefits greatly from the above discussed advantages of natural convection of seawater as shown in FIGS. 14-15.

Because the entire space within vessel outer shell 206 is filled with liquid coolant 1602, which is non-compressible, the surrounding seawater hydrostatic pressure cannot buckle outer shell 206. Therefore, expensive outer shell 206 materials that withstand hydrostatic buckling are not necessary because the internally filled coolant 1602 is maintained at a pressure equal to that of the surrounding seawater at depth. Plexiglas, high-density polyethylene (HDPE), phenolic plastics or other materials with a higher thermal conductivity that are both corrosion and bio-fouling resistant are ideal. For example, in data vessels 100 utilizing heat exchanger 1600 accordingly, this would markedly reduce the cost of the pressure vessel further improving the techno-economic advantages based on a cost per computational equipment power usage ($/W) metric.

Heat exchanger 1600 may further include a pressure regulator 1616 that prevents saltwater ingress into the interior space within outer shell 206 by creating a pressure bias to force coolant 1602 to the exterior should there be a seal leak. Pressure regulator 1616 is an embodiment of pressure regulator 112.

Heat exchanger 1600 evolves the data vessel 100 to remove a closed loop air-liquid heat exchanger thus improving $/W, increasing computational densities and improving reliability. For instance air-liquid dual loop heat exchangers utilize an external heat exchanger, outer shell penetrations, cooling pump circuit with internal heat exchanger and fans. In heat exchanger 1600 topology, the internal components are modified for pressure tolerance so internal cooling fans may be replaced, if desired, by a process of natural convection whereby circulation is enabled by the heat pickup off of heat generating components (e.g. server boards 304). If enough natural convection occurs, then the internal heat exchanger may be eliminated whereby natural convection circulates warmer liquid to the outer shell of the pressure vessel where heat is transferred through the outer shell 206 via conduction. Again if natural convection phenomena (e.g. convection 1608) is dominant, then the heat exchanger, fan and cooling pump system may be replaced by the process where heated coolant flows to the outer shell 206 and a larger surface area through pin fins, if included, and conducted to the external heat sink (the surrounding water). The marine subsea data vessel 100 may be further simplified by eliminating the external heat exchanger all together and replacing it with external heat sink fins (not shown) to increase the heat dissipation area.

The above discussed benefits are shown where, for a given form factor of a standard 40 foot shipping container, 300 kW could be dissipated by an air-liquid approach at 37 kW per a 42U server board carousel. Liquid heat transfer has an order of magnitude efficiency benefit whereby the proposed technology is enabling for elemental cooling such as heat exchanger 1000 having >648 kW in a 9 ft diameter by 40 ft vessel (i.e. 80 kW per a 42U server board rack), heat exchanger 1100 having >800 kw in a 9 ft diameter by 40 ft vessel to immersive techniques such as biodegradable Royal Purple hydraulic fluid used in heat exchanger 1600 having >1 MW in a 9 ft diameter by 40 ft vessel. This would represent a closed system that conducts heat through the outer shell thereby eliminating the internal heat exchanger and fans and reducing the constant system noise level to less than 120 dB. Liquid immersive cooling requires the server boards be pressure tolerant, conformal coated and use solid state equipment which can function in an incompressible medium. This would reduce some of the marine subsea data vessel 100 structural needs which are a major cost element when operating at significant depths.

In certain embodiments, heat exchanger 1600 may also be used with a supercritical or high internal pressure coolant other than a liquid. For example, a high-internal pressure coolant, such as $CO_2$, that necessitates a higher internal pressure than the external hydrostatic pressure. Because the internal pressure is greater than the outer pressure, this outer shell 206 may have technical and economic advantages. For example, outer shell 206 may consist of a thin walled composite structure in tension, which the higher internal pressure affords. The thin wall outer shell 206 also assists in thermal conduction through the outer shell 206 whereby composite structures typically have low values of thermal conductivity. Copper or another thermally conductive medium can be woven into the thin, all-composite structure of outer shell 206 to assist in the dissipation of heat via conduction through the outer shell 206.

Figure 17:
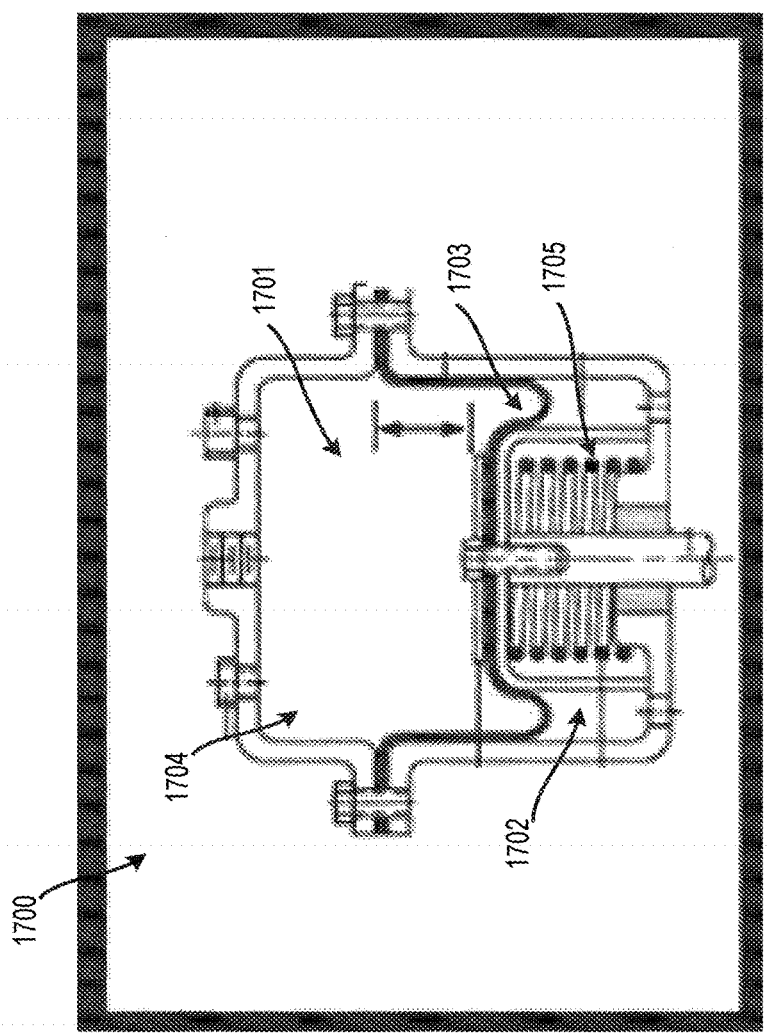
FIG. 17 depicts an exemplary pressure regulator, in embodiments.

FIG. 17 depicts an exemplary pressure regulator 1700, in embodiments. Pressure regulator 1700 is an example of pressure regulator 1616 used with heat exchanger 1600, of FIG. 16, for example. In pressure regulator 1700 liquid coolant 1704 is contained in the upper chamber 1701 and is connected to outer shell 206. Seawater from the surrounding, external environment enters lower chamber 1702 and applies hydrostatic pressure to diaphragm 1703 whereby diaphragm applies pressure to liquid coolant 1704. Spring 1705 applies additional pressure to diaphragm 1703 resulting in a liquid coolant 1704 pressure slightly higher than the surrounding seawater pressure.

Figure 18:
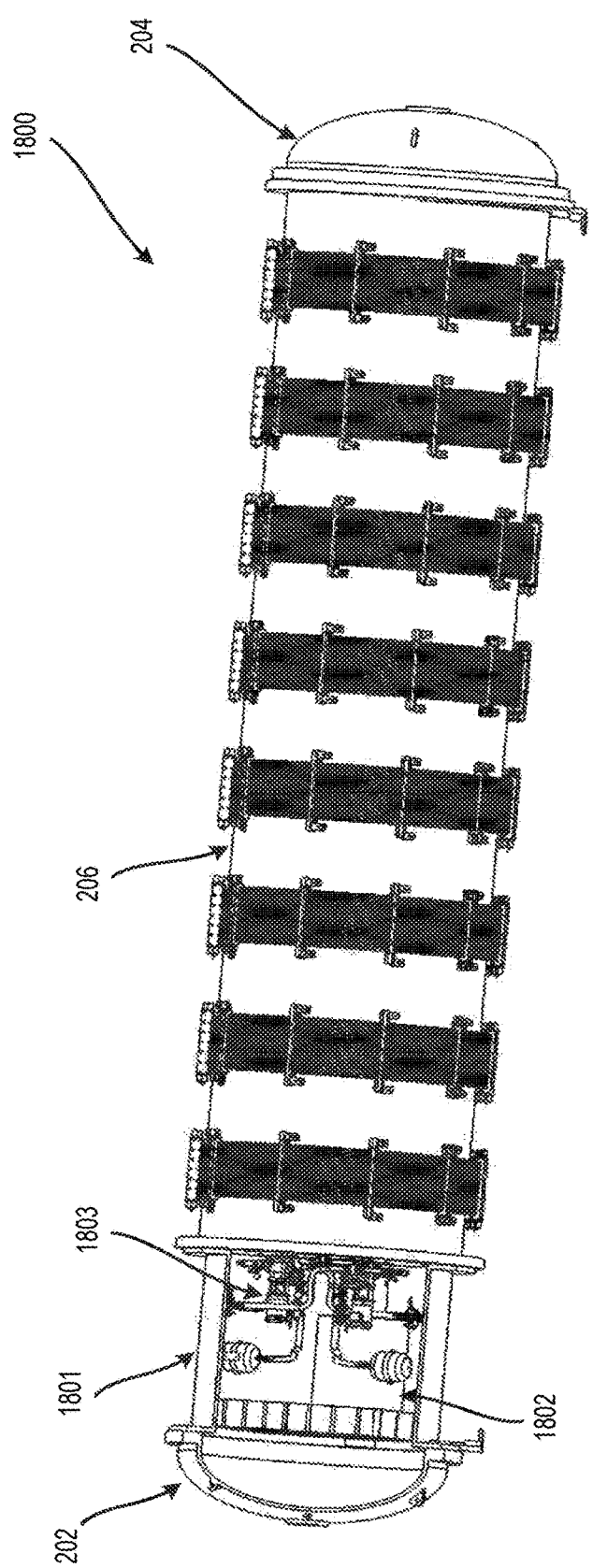
FIG. 18 depicts an exemplary data vessel with external mini-tube heat exchanger and internal cooling system for use with the marine subsea data vessel of FIGS. 1-8, in an embodiment.

FIG. 18 depicts an exemplary optional internal power conditioning and cooling system 1800 for use with marine subsea data vessel 100, of FIG. 1, in an embodiment. In this embodiment subsea data vessel 100 is fitted with outer shell extension 1801 to outer shell 206 and endcaps 202, 204 remain unchanged. Power conditioning components 1802 and cooling system components 1803 are contained in outer shell extension 1801. Power conditioning components 1802 serve to supply power of the proper specifications and a back-up power supply to server boards 304. Cooling system components 1803 serve in the same manner as depicted in FIG. 9.

None of the prior-art heat transfer mechanisms are contemplated, made possible or considered by U.S. Pat. No. 7,525,207 to Clidaras et al. ("Clidaras") and in fact are impossible to achieve by simply taking the barge topology and submerging it. The rectangular shipping container placed on a barge topology presented by Clidaras and Nautilus Data Technologies (see, e.g., http://nautilusdt.com/) are not physically submersible due to hydrostatic buckling. Submergence requires specialty engineered marine pressure vessels and seals designed to Det Norske Veritas/Germanischer Lloyd (DNVGL) or American Bureau of Shipping (ABS) standards to resist hydrostatic pressures, buckling, corrosion, and bio-fouling without deleterious consequences to heat transfer that were validated by the author in recent testing. Additionally, for this application marine subsurface electrical power and data transmission cables and connectors rated for the submergence depth are required.

Furthermore, seafaring barges utilize an open loop heat exchanger requiring that cold seawater be pumped into the containers top side in contrast to a marine subsea data vessel where the dual loop heat exchangers with a heat exchanger (e.g. heat exchanger 904) internal to the vessel, with fans (e.g. fan 908) evacuate heat via an external heat exchanger (e.g. heat exchanger 906) to the surrounding cool seawater. The closed-loop system designed for the submerged data center can automatically control fan speeds and coolant pump delivery based on computational (heat) load, reducing parasitic loads and further improving the economics of the systems.

The airflow in the vessel is designed to further chill the internal temperature by directing fan flow to the heat exchanger and then along the vessel outer shell 206 surface whereby heat is further dissipated through the outer shell via conduction. The closed systems discussed herein are more environmentally friendly than an open loop system, as it is a well-known issue that cooling intakes can draw in and harm fish larvae or other aquatic life forms, as well as having corrosion or bio-fouling impacting pump and cooling performance. As a case in point from recent testing the thermal performance of closed loop, external heat exchangers 1200 and 1250 dissipated heat substantially better than predicted.

In addition, with the marine subsea data vessel based on air-liquid cooling systems, a lights out facility requires temperature stability only accomplished by being completely filled with a humidity controlled and nitrogen back-filled atmosphere delicately balanced for disk drive foil bearings and elimination of electrostatic discharge (ESD). In contrast a standard shipping container cannot resist hydrostatic pressure, be hermetically sealed and is not capable of resisting an internal vacuum to control the environment necessary to attain the reliability required for a lights out facility. The standard shipping container approach does not meet standards to accomplish marine submersions nor allows heat transfer phenomena such as forced convection, self-convection, or conduction.

Grouped Data Vessels and Docking Station:

The principle objectives of marine subsea data vessel clustering include, but are not limited to: 1) to contain within the data vessel only the server board carousel stack and internal cooling, power and data cables and circuits. 2) Allow marine subsea data vessels to be clustered to a common platform or docking station permanently anchored and connected to a power and data network. 3) The docking station and marine subsea data vessels may be brought to the surface or submerged to operating depth by ballasting and or winching down to a gravity anchor on the seabed. 4) The docking station contains the ancillary equipment for marine subsea data vessel operation including pumps, external heat exchangers, transformers, other power storage and conditioning systems, data network, controls/supervisory control and data acquisition (SCADA) system and may have an umbilical conduit extending below to draw deeper, cooler water for the heat exchangers. 5) When the docking station is surfaced the external heat exchangers remain below the water line allowing continued operation. 6) All connections between the docking station and the marine subsea data vessels can be made when surfaced, precluding the need for divers or remotely operated vehicles (ROV's). 7) A marine subsea data vessel can be changed-out, typically every three to five years, at sea by means of disconnecting mechanical, plumbing and electrical connections between the marine subsea data vessels and the docking station and using the surface deck crane to lift and extend the marine subsea data vessel away from the docking station for pickup by the service vessel. The process is reversed for installing a data vessel. 8) Such clustering reduces the amount of power and data cable required for the marine subsea data vessels and enables very high computing capacity per unit of water surface. As used herein, the term "docking station" and "chamber" may be used interchangeably.

Figure 19:
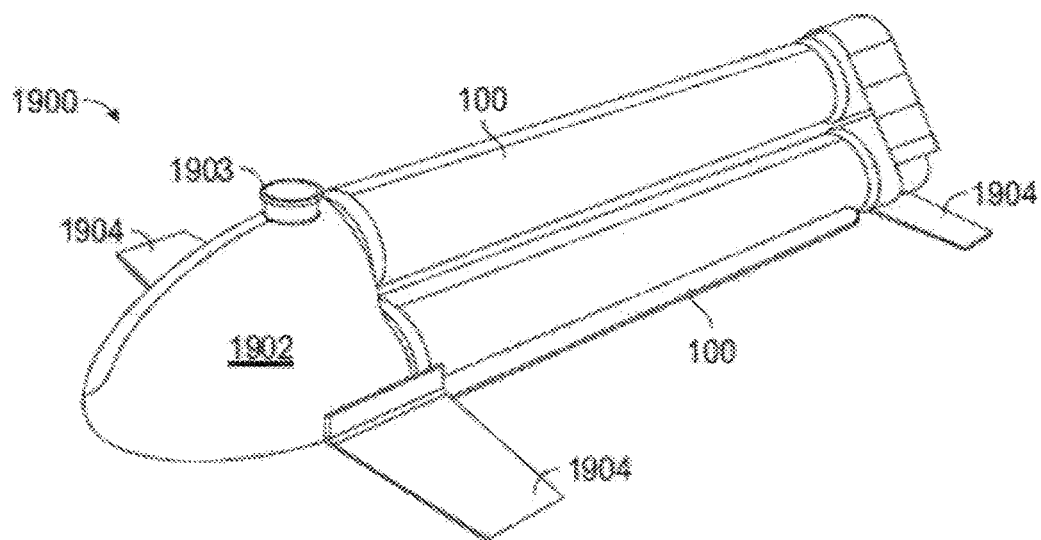
FIG. 19 depicts one exemplary marine current docking station with three data vessels, in an embodiment.

FIG. 19 depicts one exemplary marine subsea data vessel cluster 2600, designed to operate in a marine current, anchored and moored to the seabed or connected to a seabed mounted structure such as an offshore wind turbine foundation, a marine current turbine or other fixed structure, in an embodiment. Marine subsea data vessel cluster 1900 includes a plurality of marine subsea data vessels 100, including one or more features discussed above in regards to FIGS. 1-18. Marine subsea data vessel cluster 1900 is shown including a trio of marine subsea data vessels 100, but may include more or fewer without departing from the scope hereof. Marine subsea data vessel cluster 1900 includes the docking station 1902, accessible via hatch 1903. Marine subsea data vessel cluster 1900 may operate in similar manner to a submarine but, rather than being propelled through the water, operates in a marine current and is moored to the seabed.

The docking station is configured to mount each of marine subsea data vessels 100 together in the shown trio. Attached to docking station 1902 may be a plurality of diving planes 1904 and ballasting, for controlling depth in a current, of a marine subsea data vessel cluster 1900 and which can be surfaced for servicing or data vessel change out. Depth fins 1904 are one embodiment of depth regulator 114, of FIG. 1.

Marine subsea data vessel clusters may include a docking station having a longitudinal axis that is non-parallel with the respective longitudinal axis of each of marine subsea data vessel 100 such that docking station is coupled to each marine subsea data vessel into a cluster. In embodiments, each respective longitudinal axis of each marine subsea data vessel 100 may be substantially parallel. In embodiments, the longitudinal axis of each marine subsea data vessel 100 may be perpendicular to longitudinal axis of the docking station. In certain embodiments, the docking station contains all of the ancillary equipment indicated above. The docking station may include various attachments for attaching anchor/mooring lines such that marine subsea data vessel cluster is moored and anchored to the sea floor. Attachments and anchor lines may additionally or alternatively be coupled with one or more clusters of marine subsea data vessels 100. Docking station and marine subsea data vessels may be brought to the surface by reducing ballast in the docking station and/or releasing the winched vertical mooring lines. Marine subsea data vessel clusters may also include a power/data cable for providing power and data transmission to/from marine subsea data vessel cluster. As such, any of the marine subsea data vessels and docking systems discussed herein may further include a power/data cable similar to power/data cable 2012.

Figure 20:
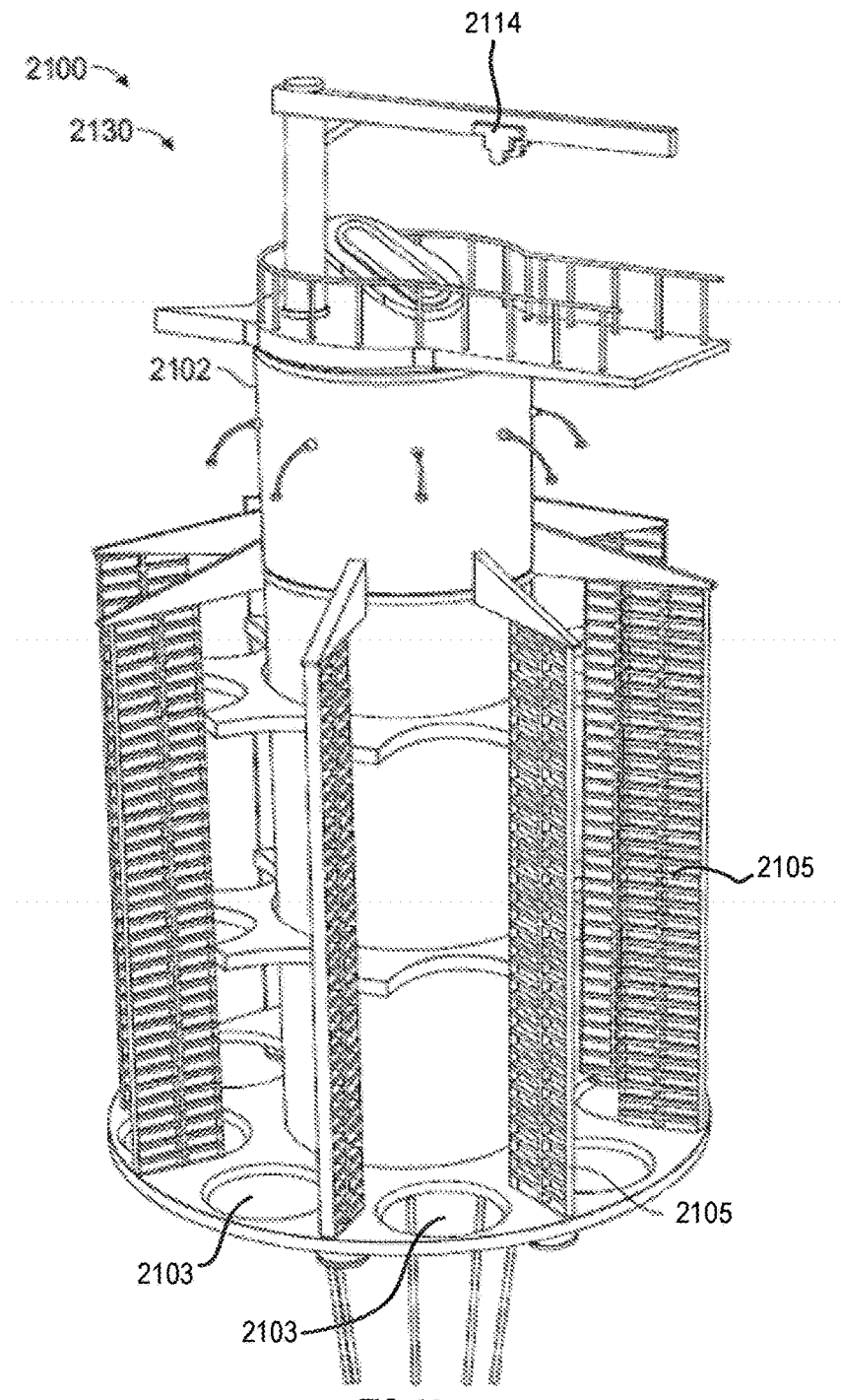
FIG. 20 depicts another exemplary marine subsea data vessel cluster, in an embodiment.
Figure 21A:
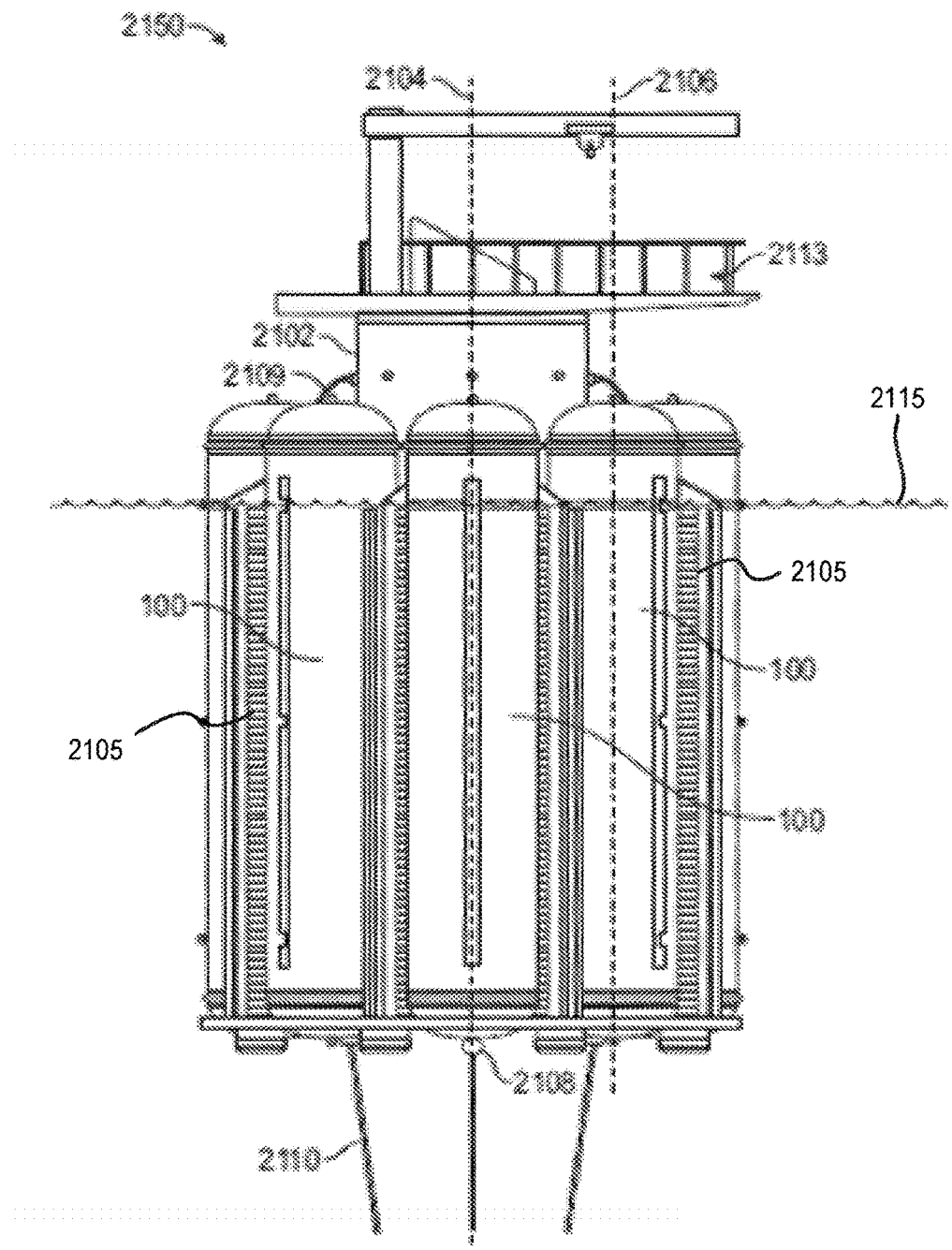
FIG. 21A-B depicts additional exemplary views of the cluster of data vessels and docking station in FIG. 20, in an embodiment.
Figure 21B:
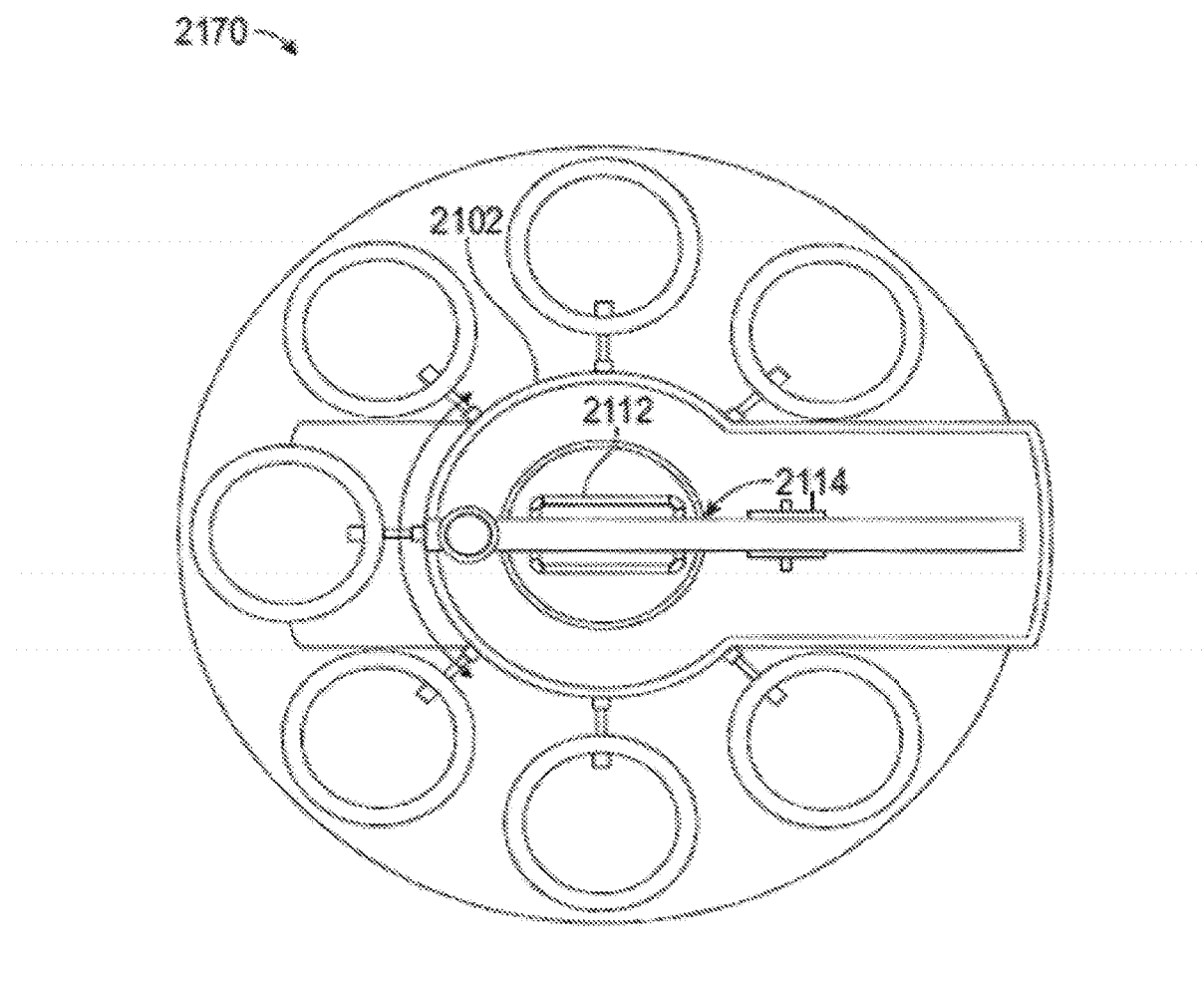

FIG. 20 depicts another exemplary marine subsea data vessel cluster 2100, in an embodiment. FIGS. 21A, 21B depict additional views of the marine subsea data vessel cluster 2100, in embodiments. Docking station 2100 is shown in three views 2130 (FIG. 20), 2150 (FIG. 21A), 2170 (FIG. 21B) and includes a plurality of marine subsea data vessels 100, including one or more features discussed above in regards to FIGS. 1-18. Not all elements are labeled within each of views 2130, 2150, 2170 for clarity of illustration. Marine subsea data vessel cluster 2100 may include a chamber 2102 having the center of buoyancy near the top of the chamber and the center of mass near the bottom and a longitudinal axis 2104 that is substantially parallel with the respective longitudinal axis 2106 of each marine subsea data vessel 100 such that chamber 2102 couples each marine subsea data vessel 100 into a group.

As shown in FIG. 20, the chamber 2102 may include a plurality of data vessel attachment locations 2103 for receiving data vessels 100. FIG. 20 depicts chamber 2102 not attached with data vessels 100, whereas FIGS. 21A-21B depict chamber 2102 attached with data vessels 100. Associated with each data vessel attachment location 2103 may be a heat exchanger 2105. Each heat exchanger 2105 may couple with the data vessel 100 and operate as an external heat exchanger as discussed above.

The data vessels also have the center of buoyancy above the center of mass. Each longitudinal axis 2106 of each respective vessel 100 may be offset from one another. For clarity of illustration, only one of axis 2106 is shown in view 2150. In embodiments, each marine subsea data vessel 100 and heat exchangers may surround the outer surface of chamber 2102 vertically and in a radial configuration as shown in each of views 2130, 2150, 2170.

Docking station 2102 may include various attachments 2108 for attaching anchor/mooring lines 2110 such that marine subsea data vessel cluster 2100 is attached to the sea floor. Anchor/mooring lines 2110 may include a winch for controlling depth of docking station 2102. Attachments 2108 and anchor/mooring lines 2110 may additionally or alternatively be coupled with one or more cluster of marine subsea data vessels 100 and their respective docking stations.

The docking station and marine subsea data vessels are designed to operate below the water surface, moored to anchors on the seabed. The docking station and marine subsea data vessels are positively buoyant and can be brought to the surface (i.e. above water surface 2115 by releasing ballast and/or releasing the mooring line winch (which may be a portion of attachments 2108). Docking station 2102 includes an upper hatch 2112 for entry therein. In embodiments, anchor/mooring lines 2110 may be configured such that upper hatch 2112 is located above water surface 2115, and the marine subsea data vessels 100 are located sufficiently below the water surface 2115 to achieve desired heat transfer even when accessible by an operator. The surface deck 2113 and crane 2114 can be rotated about the access hatch to align over a marine subsea data vessel for removal/replacement. The operating crew can board the surface deck 2113, access the docking station interior, connect/disconnect docking station umbilical(s) 2109 (power, data cooling, SCADA, etc.) to the marine subsea data vessels while working above the water surface and also remove and replace a data vessel which has reached its performance life. Because the data vessel 100 is individually removable from the chamber 2102, each data vessel 100 may be removed while allowing other data vessels attached to chamber 2102 to continue operation under water surface 2115.

Figure 22:
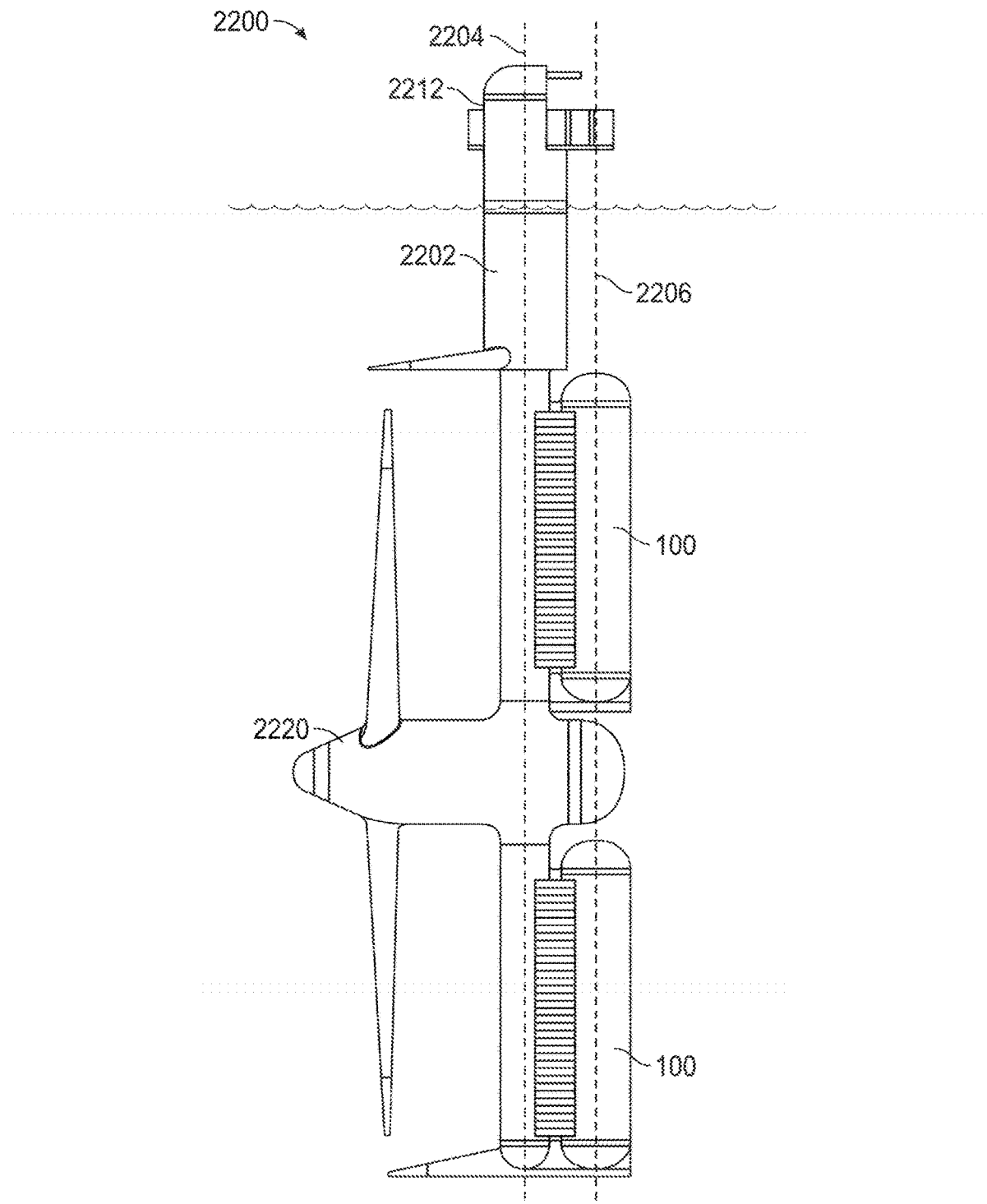
FIG. 22 depicts another exemplary cluster of two data vessels integrated with a marine current turbine serving as both docking station and power source, in an embodiment.

FIG. 22 depicts another exemplary marine subsea data vessel cluster 2200, in an embodiment. The marine current turbine of marine subsea data vessel cluster 2200 also serves as a docking station which includes a plurality of marine subsea data vessels 100, including one or more features discussed above in regards to FIGS. 1-18. The marine current turbine 2220 of marine subsea data vessel cluster 2200 may include a turbine power train chamber 2202 having a horizontal rotor axis 2204 that is substantially perpendicular to the spar vessel 2202 to which data vessels 100 are attached to. The longitudinal axis 2206 of each of data vessels 100 is such that spar 2202 couples to each marine subsea data vessel 100. The external heat exchangers 2208 for data vessels 100 are permanently mounted on the turbine spar. The longitudinal axis of each marine subsea data vessel 100 may be substantially aligned, as shown in FIG. 22, or offset in some embodiments.

The spar buoyancy chamber 2202 is shown attached to a current turbine power generator 2220. Power generator 2220 is an embodiment of power source 104 (FIG. 1). Power generator 2220 may be a renewable energy power generation system such as a marine hydrokinetic (MHK) ocean current generator, a wave energy power system or a marine based solar collector array or other form of power supply. Offshore oil and gas platform or a wind turbine foundation may have a data vessel removably attached to a foundation leg, where ancillary equipment supporting the data vessel is stored on the oil and gas platform or wind turbine foundation. For example, power generator 2220 may be any one or more of the power generators discussed in U.S. patent application Ser. No. 14/682,700, entitled "Floating Yawing Spar Current/Tidal Turbine"; U.S. Pat. No. 9,334,849, entitled "Floating Tower Frame"; U.S. Pat. No. 8,766,466, entitled "Submerged Electricity Generation Plane with Marine Current-Driven Rotors"; and U.S. Pat. No. 9,080, 548, entitled "Method for Controlling Depth of a Buoyant Submersible Apparatus in a Fluid Flow", each of which are hereby incorporated by reference. An ocean current turbine power source may provide continuous power with a capacity factor as high as 74%. By integrating this with marine subsea data vessels the marine current energy source may ameliorate the need for costly backup power systems. Marine current turbine arrays form a distributed network of turbines, which if there is a turbine failure, the balance of the array supplies the continuous power requirement. The turbine arrays use a submarine cable connection to shore to provide or sell power during low data center duty cycles or during peaking current flows.

Alternatively, power generator 2220 may be a wave energy generator (not shown) used to supply power with the electrical grid as a backup or complemented by solar, offshore wind, or another power source, while also using the existing seabed mounted or floating foundation of the power source and its connections to shore facilities to connect to the data vessel.

Chamber 2202 may include an upper hatch 2212 for entry therein. In embodiments, anchor/mooring lines 2210 (similar to anchor/mooring lines 2110) may be configured such that upper hatch 2212 is located above water level, and the marine subsea data vessels 100 and heat exchangers 2208 are located below the water level to achieve the desired heat transfer and cooling.

The marine subsea data vessel cluster discussed above illustrate that marine subsea data vessels 100 may be clustered together to improve the techno-economics based on capital cost and operations and maintenance costs using a $/W metric. This is achieved by amortizing the costs of anchoring/mooring and power and data connections into a single submersible structure. The above discussed docking stations (chambers) may include data vessel change-out which is performed by surface deck crane to hoist each removable data vessel up and away from the chamber for pickup and replacement by an operating crew service vessel.

Also, as indicated above adopting the radial server board carousel 302 offers an order of magnitude improved heat flux through liquid-liquid heat exchanges. System economics is further improved by server board 304 density and enabling accessibility on an elemental ½U server board basis which is not achievable through current state of the art, 12U to 42U, server board racks. This arrangement therefore increases computational densities for a given capital expenditure thus improving $/W.

Depth Regulator Embodiments:

Any of the above discussed embodiments of a marine subsea data vessel or marine subsea data vessel cluster, including embodiments 100, 200, 1900, 2000, 2100, and 2200 may include depth regulator 114. Depth regulator 114 may be variable ballast, winching a mooring line to the seabed anchor or using dive planes in a marine current, such as dive planes 1904 discussed above. Depth regulator 114 is implemented for depth adjustment to achieve greater heat transfer at lower ambient seawater temperature in deeper depths with improved temperature stability and operational reliability of the marine subsea data vessel. This is problematic with land- or barge-based data centers where there may be a wide seasonal temperature range, impacting the life of server boards through thermal cycling. A stable thermal balance could be provided by controlling the depth of marine subsea data vessel 100 along the temperature gradient. This would also prevent the possibility of a vapor lock which would in turn prevent quenching and damaging server boards 304.

Power Source Embodiments:

Any of the above discussed embodiments of a marine subsea data vessel or marine subsea data vessel cluster, including embodiments 100, 200, 1900, 2000, 2100, and 2200 may include power source 104. Power source 104 may include, but is not limited to, one or more of the following.

Figure 23:
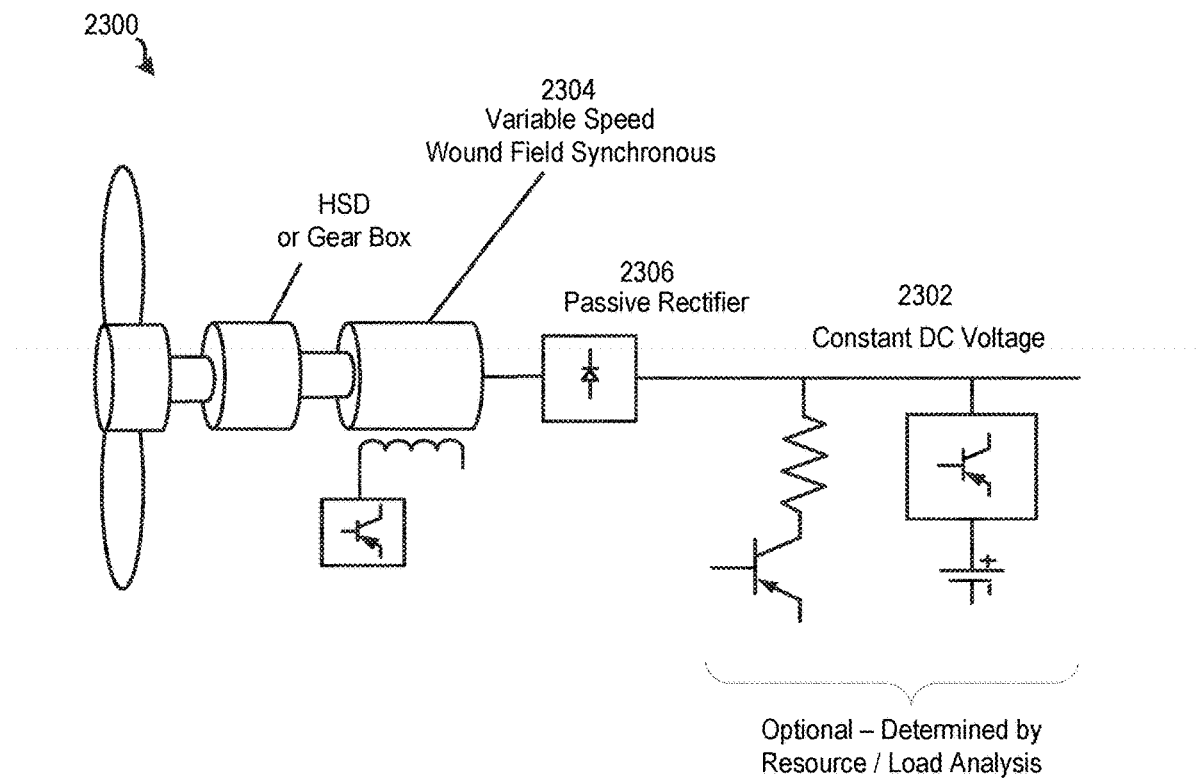
FIG. 23 depicts an exemplary modification of a marine current turbine producing a constant DC voltage, in an embodiment.

In embodiments, power source 104 includes a MHK power source such as that described with reference to power generator 2220. FIG. 23 depicts an exemplary modification 2300 of a MHK turbine producing a constant DC voltage 2302, in an embodiment. This embodiment is a hydraulic motor generator (HMG) approach whereby its constant speed drive output could be coupled to a wound field synchronous generator 2304 with passive rectification 2306 to DC voltage to eliminate AC/DC conversions.

Figure 24:
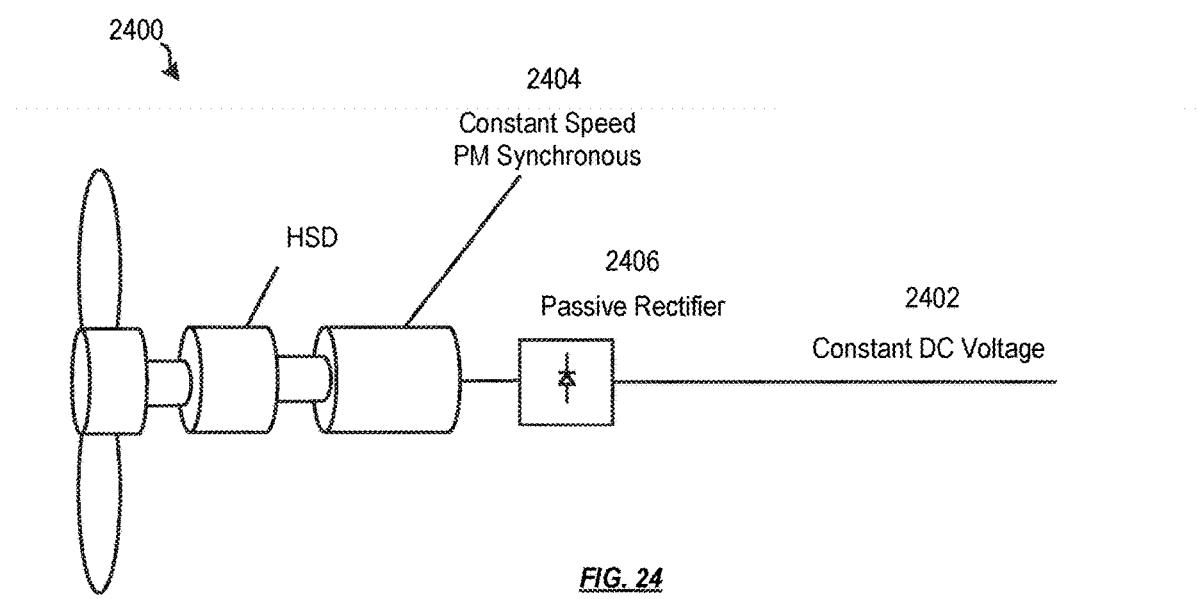
FIG. 24 depicts an exemplary modification of a marine current turbine producing a constant DC voltage, in another embodiment.

FIG. 24 depicts an exemplary modification 2400 of a MHK turbine producing a constant DC voltage 2402, in another embodiment. This embodiment is a HMG approach whereby its constant speed drive output could be coupled to a permanent magnet (PM) synchronous generator 2404 with passive rectification 2406 to DC voltage to eliminate AC/DC conversions.

In embodiments, power source 104 includes at least one fuel cell powered by a natural gas supply wherein the docking station could be positioned near a marine gas field to supply gas to prime mover coupled generators on-board the docking station. An example of a fuel cells is the solid oxide fuel cell (SOFC) or the polymer electrolyte membrane (PEM).

In embodiments, power source 104 includes a small offshore nuclear power plant such as Terrapower providing an integrated power source.

In embodiments, power source 104 includes a remotely located power source transmitting power by microwave beam to a rectenna connected by electric cables to the data vessel docking station.

In embodiments, power source 104 includes an offshore wind turbine. Offshore wind energy production is advancing rapidly and presents existing infrastructure which can serve to couple with data vessel deployment where i) the data vessel can be mounted to the foundational structure of the wind turbine below the water surface, ii) the grid power connection of the turbine may also incorporate fiber optic network connection, iii) efficient water cooling is used as described in the foregoing description, iv) electric power utilization at the wind turbine source is efficient, vi) wind turbine tower platform can be used for accessing the data module and module change-out as necessary. The offshore wind turbine platform thus serves the function as described for the docking station. This description of the advantages also applies to offshore oil and gas platforms dockside, canal, river and similar marine deployment of data vessels to new and existing infrastructure.

In embodiments, power source 104 includes an underwater cable coupled to the land-based power grid. Power via the grid and remote power sources such as marine current turbines may eliminate the need for back-up power generating capacity where the submarine cable provides a means of power supply to the grid, when the marine subsea data vessels duty cycle warrants the sale of excess power.

Figure 25:
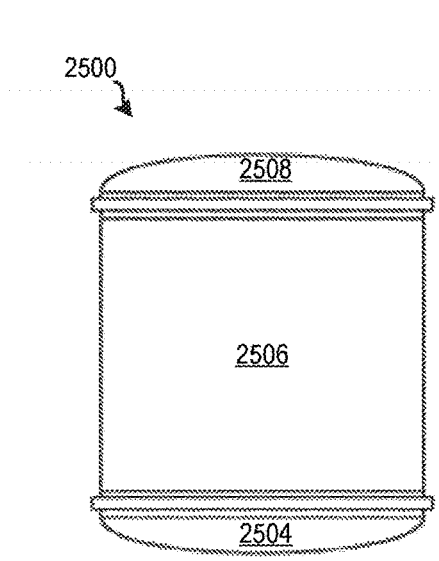
FIG. 25 depicts a land based data vessel, in an embodiment.
Figure 26:
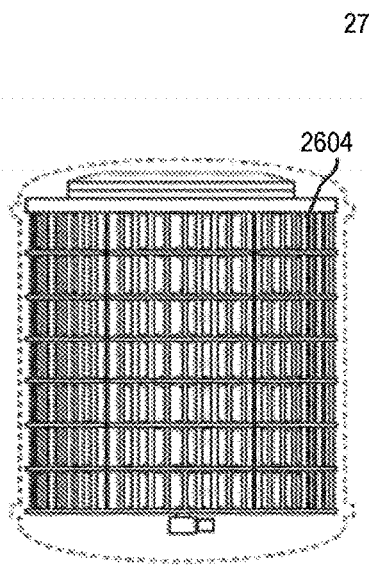
FIG. 26 depicts the land based data vessel of FIG. 25 without an outer shell, in an embodiment.
Figure 27:
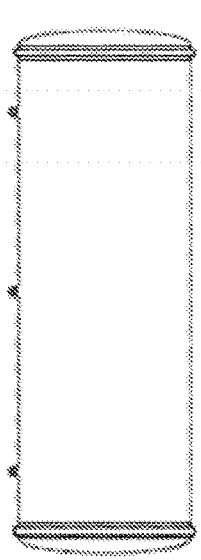
FIG. 27-28 depicts elongated versions of the land based data vessel of FIGS. 25-26, respectively.
Figure 28:
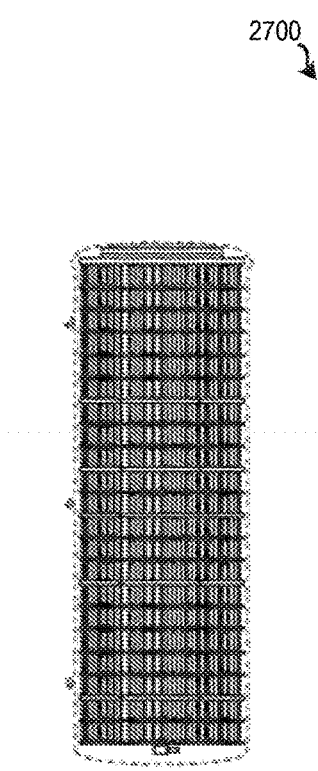

FIGS. 25-30 depict another variant of the data vessel as a land based data vessel. FIG. 25 depicts land based data vessel 2500 having outer shell 2506 (similar to outer shell 206) and endcaps 2504, 2508 (similar to endcaps 204, 208). FIG. 26 depicts land based data vessel 2500 having outer shell 2506 and endcaps 2504, 2508 dashed out to view carousel 2602 having a plurality of data boards 3604, which are each respectively similar to carousel 302 and data boards 304. Outer shell 2506 may include a high R-factor insulation material. FIGS. 27 and 28 depict an elongated version 2700 of land based data vessel 2500 corresponding to FIGS. 25, 26, respectively. Land based data vessel 2500 enables vertical construction of data servers in high density urban areas where real estate is at a premium. The carousel air and/or liquid cooling approach discussed above, provides efficient cooling circulation on the server boards and can be used within land based data vessel 2500, increasing computational density per unit of floor space relative to current land based data centers.

Figure 29:
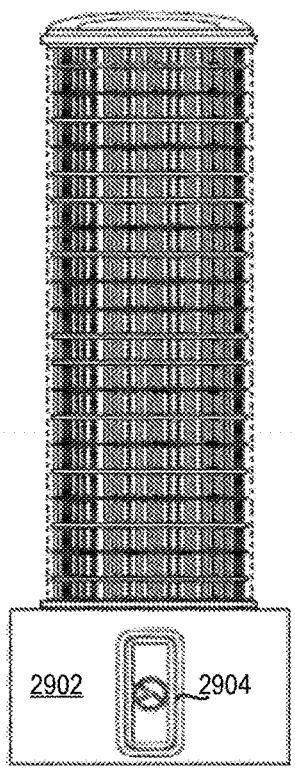
FIGS. 29-30 depict the land based data vessel of FIGS. 27-28 vertically attached to a base structure, in an embodiment.
Figure 30:
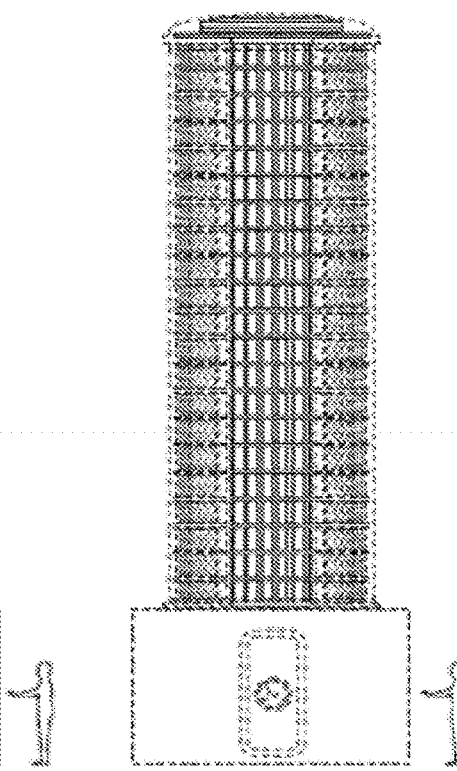

As shown in FIGS. 29-30, land based data vessel 2700 (or 2500) may be attached in a vertical configuration atop a base 2902 having an entry 2904. Entry 2904 may be a hatch or other floor-level entry into the structure forming base 2902. Base 2902 may further include a lift, or ladder (not shown) for allowing access to the interior plenum of data vessel 2500. Moreover, although only shown as having a single interior space within outer shell 2506, it should be appreciated that data vessel 2500 may be partitioned to form distinct chamber levels optimized for cooling circulation and heat extraction within each partition.

Land based data vessel 2700 may use liquid cooling supplied by a chilled water source or pumped from a local body of water. Land based data vessel 2700 may also use power based cooling from an air conditioning system. For example, FIG. 31 depicts land based data vessel 2700 using cooling supplied by a land-based air (or liquid) cooling system 3100. FIG. 32 depicts land based data vessel 2700 using liquid cooling supplied from a local body of water 3200. Coolant from land based data vessel 2700 is piped via conduits 3202 to an external heat exchanger 3204 located in water 3200. Alternatively, it should be appreciated that water 3200 could be pumped to land based data vessel 2700 without utilizing external heat exchanger 3204.

Thus, heat transfer from the data vessel 2500 may be performed by a liquid cooling circuit to nearby exterior chillers or body of water. The land based data vessel 2500 provides the carousel server stack topology discussed above which has an ideal configuration for efficient fluid (air or liquid) circulation and heat extraction to perform uniform and efficient server board 2504 cooling with low energy consumption for the cooling function as previously described. This is also an improvement on a $/sqft approach of present day land based data server modules and more quickly deployed in high population density, high demand areas to reduce latency, lower total cost of ownership, and improve scalability/virtualization growth. This vertical topology differs from standard shipping container approaches that house 250 kW of air cooled servers per container while with the data vessel stacked vertically, computational density is increased, with a smaller land unit footprint, and with enhanced energy efficiency.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A data vessel, comprising:
an outer shell forming an interior space;
at least one data server including a plurality of server boards forming a carousel located in the interior space, the carousel having an inner plenum aligned on an axis of the data vessel;
a heat exchanger adapted to disperse heat generated by the plurality of server boards to the exterior of the data vessel;
a depth regulator for controlling depth of the data vessel.

2. The vessel of claim 1, the outer shell sealed with at least one endcap.

3. The vessel of claim 2, at least one of the at least one endcap including a hatch providing access to the inner plenum.

4. The data vessel of claim 1, further comprising a communications interface for transferring data to and/or from the plurality of server boards, the communications interface selected from the group of communications interface including: wired communication protocols, and wireless communications protocols including, wireless cellular links, line of sight satellite, WiFi, balloon and solar/microwave beam powered drones.

5. The data vessel of claim 1, the heat exchanger comprising:
an internal heat exchanger,
an external heat exchanger, and
a coolant pump adapted to cycle coolant through a closed loop cycle including: through the internal heat exchanger, through the outer shell via an outlet into the external heat exchanger, and back to the internal heat exchanger via an inlet through the outer shell.

6. The data vessel of claim 5, further including an internal fan for circulating air, or propulsor for circulating fluid, within the interior space in a toroidal circulation pattern such that the air or fluid rises on an inner surface of the outer shell and cooled air or fluid descends within the inner plenum.

7. The data vessel of claim 6, the internal fan or propulsor being (i) located at an endcap sealed to the outer shell, (ii) a barrel fan or propulsor located within the inner plenum, or (iii) caused widening of spacing of the server boards within the carousel such that thermal expansion of the air or fluid due to heat generated by the plurality of serve boards causes convective flow to propel the air or fluid towards the outer shell.

8. The data vessel of claim 5, the internal heat exchanger comprising a concentric heat exchanger in the endcap or in the inner plenum of the carousel.

9. The data vessel of claim 5,
the data vessel and the external heat exchanger attached to an offshore foundation supporting a wind turbine or oil and gas platform,
the data vessel and the external heat exchanger located below a water surface, and, ancillary equipment supporting the data vessel being located on a deck of the offshore foundation.

10. The data vessel of claim 1, further comprising a pressure regulator for creating a higher internal pressure within the interior space than outside the interior space.

11. The data vessel of claim 1, the outer shell including one or more radial rings and/or one or more longitudinal stiffeners.

12. The data vessel of claim 1, the depth regulator comprising one or more ballast and/or winch attached to a mooring line, or by a dive plane in a current.

13. The data vessel of claim 1, further comprising a submersible chamber attached to the data vessel, the chamber being moored and having a power and communication cables and including ancillary support equipment for the data vessel.

14. The data vessel of claim 13, the chamber having a hatch thereon such that, when surfaced, the hatch and a top portion of the data vessel are above a surface of a cooling medium outside the data vessel,
the heat exchanger being coupled to the chamber such that, when surfaced, the
heat exchanger is below the surface of the cooling medium for continued operation when the chamber and data vessel is surfaced.

15. The data vessel of claim 13, the chamber being coupled with a power source for powering the data vessel, the power source being external to the data vessel.

16. The data vessel of claim 13, the chamber coupled to at least one additional data vessel forming a cluster of data vessels.

17. The data vessel of claim 13, the chamber being removable coupled to the data vessel while the chamber is moored at sea such that other data vessels continue to operate when the data vessel is removed from the chamber.

18. The data vessel of claim 13, the chamber containing ancillary equipment utilized by the data vessel including one or more of an external heat exchanger, transformer, power and condition systems, data network, controls/supervisory control and data acquisition, and an umbilical conduit for drawing cool external fluid from below the data vessel.

19. The data vessel of claim 13 wherein connections between the data vessel and chamber are accessible when the chamber is surfaced and the outer shell is only partly surfaced.

20. The data vessel of claim 13, the chamber coupled to additional data vessels in a horizontal configuration, the chamber having a hatch extending vertically.

21. The data vessel of claim 1, further comprising a power source selected from the group of power sources including:
   (a) either grid connected or isolated from a land-based power grid;
   (b) marine hydrokinetic power source;
   (c) fuel cell based on natural gas;
   (d) nuclear power source.

22. The data vessel of claim 1, the chamber coupled to a plurality of additional data vessels in a vertical configuration, the chamber having a center of buoyancy near a top of the chamber and a center of mass near a bottom of the chamber.

* * * * *